(12) United States Patent
Kang et al.

(10) Patent No.: US 12,740,415 B2
(45) Date of Patent: Sep. 15, 2026

(54) SEMICONDUCTOR DEVICE WITH 2-PHASE COOLING STRUCTURE

(71) Applicant: SAMSUNG ELECTRONICS CO., LTD., Suwon-si (KR)

(72) Inventors: Sungchan Kang, Suwon-si (KR); Daehyuk Son, Suwon-si (KR); Seogwoo Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 351 days.

(21) Appl. No.: 18/514,514

(22) Filed: Nov. 20, 2023

(65) Prior Publication Data

US 2024/0321680 A1 Sep. 26, 2024

(30) Foreign Application Priority Data

Mar. 24, 2023 (KR) ........................ 10-2023-0039008
May 15, 2023 (KR) ........................ 10-2023-0062694

(51) Int. Cl.

*H01L 23/427* (2006.01)
*H01L 25/065* (2023.01)
*H10W 40/73* (2026.01)
*H10W 90/00* (2026.01)
*H10W 90/20* (2026.01)

(52) U.S. Cl.

CPC ........... *H10W 40/73* (2026.01); *H10W 90/00* (2026.01); *H10W 90/288* (2026.01)

(58) Field of Classification Search

CPC ..... H10W 40/47; H10W 40/70; H10W 40/73; H10W 90/00; H10W 90/288

See application file for complete search history.

(56) References Cited

U.S. PATENT DOCUMENTS 6,651,735 B2 11/2003 Cho et al.
7,372,148 B2 5/2008 Im et al.
7,990,711 B1 8/2011 Andry et al.
11,177,192 B2 11/2021 Teng et al.
11,355,418 B2 6/2022 Yu et al.

(Continued)

FOREIGN PATENT DOCUMENTS

JP 2022-157122 A 10/2022
KR 10-2002-0087845 A 11/2002

(Continued)

OTHER PUBLICATIONS

Mudwar., "Assessment of High-Heat-Flux Thermal Management Schemes", IEEE Transactions on Components and Packaging Technologies, 2001, vol. 24, No. 2, pp. 122-141 (20 pages total).

(Continued)

*Primary Examiner* — David C Spalla
(74) *Attorney, Agent, or Firm* — Sughrue Mion, PLLC

(57) ABSTRACT

A semiconductor device includes: a semiconductor chip; a cooling channel configured to allow a coolant to (i) flow in liquid phase and (ii) absorb heat generated by the semiconductor chip during operation; and a wick structure configured to generate a capillary force for moving the coolant in the liquid phase along a wall surface of the cooling channel. The wick structure includes a suspended wick structure that is disposed apart from the wall surface by a capillary distance.

19 Claims, 19 Drawing Sheets

(56) References Cited

U.S. PATENT DOCUMENTS

| | | | |
|---|---|---|---|
| 2005/0280162 | A1 | 12/2005 | Mok et al. |
| 2006/0131737 | A1 | 6/2006 | Im et al. |
| 2008/0099909 | A1 | 5/2008 | Baek et al. |
| 2009/0097206 | A1 | 4/2009 | Tomioka |
| 2011/0205708 | A1 | 8/2011 | Andry et al. |
| 2020/0103176 | A1 | 4/2020 | Ben-Menahem et al. |
| 2020/0105644 | A1 | 4/2020 | Teng et al. |
| 2020/0256623 | A1 | 8/2020 | Kojima et al. |
| 2021/0098335 | A1 | 4/2021 | Yu et al. |
| 2023/0223318 | A1* | 7/2023 | Wu ........................ H01L 23/473 257/714 |
| 2023/0269910 | A1 | 8/2023 | Kawabata et al. |
| 2023/0307316 | A1* | 9/2023 | Chen ................... H01L 25/0655 |
| 2024/0194565 | A1* | 6/2024 | Kollipara ................ H01L 21/56 |
| 2024/0203821 | A1 | 6/2024 | Kang et al. |

FOREIGN PATENT DOCUMENTS

| | | | |
|---|---|---|---|
| KR | 10-2008-0038577 | A | 5/2008 |
| KR | 10-2022-0108996 | A | 8/2022 |
| KR | 10-2024-0094775 | A | 6/2024 |

OTHER PUBLICATIONS

"ICT Energy Strategic Research Agenda", ICT Energy, 2016, No. 611004, pp. 1-60 (60 pages total).

"Heterogeneous Integration Roadmap, Chapter 20: Thermal", HIR, 2021, pp. 1-26 (28 pages total).

"Pool Boiling—Boiling Curve", Nuclear Power, 2024, https://www.nuclear-power.com/nuclear-engineering/heat-transfer/boiling-and-condensation/pool-boiling-boiling-curve/, (4 pages total).

Wei et al., "Experimental characterization and model validation of liquid jet impingement cooling using a high spatial resolution and programmable thermal test chip", Applied Thermal Engineering 152, 2019, pp. 308-318 (11 pages total).

J. Bao et al. 'Analysis on the influence of atomization characteristics on heat transfer characteristics of spray cooling', Sustainable Cities and Society, 2019, vol. 51, No. 101799 (11 pages total).

Extended European Search Report dated Jun. 17, 2024, issued by the European Patent Office in European Application No. 24150868.8.

* cited by examiner

| Capillary force simulation | Normal wick | Suspended wick |
|---|---|---|
| Model | | |
| Top view | | |

CONDENSER

SEMICONDUCTOR DEVICE WITH 2-PHASE COOLING STRUCTURE

CROSS-REFERENCE TO RELATED APPLICATION

This application is based on and claims priority under 35 U.S.C. § 119 to Korean Patent Application No. 10-2023-0039008, filed on Mar. 24, 2023, in the Korean Intellectual Property Office, and Korean Patent Application No. 10-2023-0062694, filed on May 15, 2023, in the Korean Intellectual Property Office, the disclosures of which are incorporated by reference herein in their entireties.

BACKGROUND

1. Field

The disclosed embodiments relate to a semiconductor device with a 2-phase cooling structure.

2. Description of the Related Art

Air cooling devices have been widely used for dissipating heat generated from electronic devices. However, as the power density of electronic devices has gradually increased, the use of liquid cooling devices to handle a large amount of heat has also increased. Moreover, to reduce the power consumption of data centers, there is gradually increasing interest in next-generation high-efficiency cooling systems such as liquid cooling devices. Liquid cooling methods may be classified, based on the temperature range of heat-generating components, into a single-phase liquid cooling type involving no phase change of a coolant and a 2-phase cooling type involving phase changes of a coolant. 2-phase cooling methods may be used to process heat in a wider range than single-phase cooling methods.

SUMMARY

Provided is a semiconductor device employing a 2-phase cooling structure.

Provided is a semiconductor device employing a 2-phase cooling structure capable of handling a decrease in cooling efficiency caused by air bubbles adsorbed on a heating surface.

Provided is a semiconductor device having a 2-phase cooling structure capable of increasing the flow rate of a coolant.

Additional aspects will be set forth in part in the description which follows and, in part, will be apparent from the description, or may be learned by practice of the presented embodiments.

A semiconductor device may include: a semiconductor chip; a cooling channel configured to allow a coolant to (i) flow in liquid phase and (ii) absorb heat generated by the semiconductor chip during operation; and a wick structure configured to generate a capillary force for moving the coolant in the liquid phase along a wall surface of the cooling channel. The wick structure may include a suspended wick structure that is disposed apart from the wall surface by a capillary distance.

The cooling channel may be formed by recessing an upper surface of the semiconductor chip and may include: a bottom disposed in a horizontal direction parallel to an upper surface of the semiconductor chip; and a side wall disposed in a vertical direction, the side wall connecting the upper surface of the semiconductor chip and the bottom of the cooling channel to each other. The suspended wick structure may include a first wick structure that is disposed apart from the side wall of the cooling channel.

The first wick structure may be configured to form: a first vertical capillary channel that is configured to move the coolant in the vertical direction inside the cooling channel; and a second vertical capillary channel that is disposed between the first wick structure and the side wall of the cooling channel and is configured to move the coolant in the vertical direction.

The first wick structure may include a plurality of ridges extending from the bottom of the cooling channel to positions adjacent to the upper surface of the semiconductor chip.

The wick structure may further include a second wick structure that is disposed on the bottom of the cooling channel and is configured to move the coolant along the bottom of the cooling channel in the horizontal direction by generating a second capillary force.

The suspended wick structure may further include a second wick structure that is disposed apart from the bottom of the cooling channel.

The semiconductor device may further include a package housing enclosing the semiconductor chip. The package housing may include a discharge opening through which the coolant is configured to be discharged in vapor phase from the cooling channel; and a supply opening through which the coolant is configured to be supplied in the liquid phase to the cooling channel.

The cooling channel may include a plurality of cooling channels disposed in the semiconductor chip. The discharge opening may include a plurality of discharge openings disposed in the package housing and respectively corresponding to the plurality of cooling channels.

The semiconductor device may further include a supply channel configured to guide the coolant supplied in the liquid phase through the supply opening to the cooling channel. The supply channel may include a supply wick structure that is disposed on an upper surface of the semiconductor chip and is configured to generate a second capillary force for moving the coolant in the liquid phase along the upper surface of the semiconductor chip.

The semiconductor device may further include: a coolant storage portion configured to accommodate the coolant in the liquid phase and supply the coolant in the liquid phase to the cooling channel; a supply channel including a supply wick structure that is disposed on an upper surface of the semiconductor chip and is configured to generate a second capillary force for moving the coolant in the liquid phase along the upper surface of the semiconductor chip, the supply channel being configured to guide the coolant supplied in the liquid phase from the coolant storage portion to the cooling channel; and a package housing enclosing the semiconductor chip. The coolant storage portion may be disposed in the package housing.

The package housing may include: an upper wall disposed apart from the upper surface of the semiconductor chip to form a space between the upper wall and the upper surface of the semiconductor chip, the space being disposed in communication with the cooling channel; and a side wall disposed apart from an outer wall of the semiconductor chip, the side wall forming the coolant storage portion between the side wall and the outer wall of the semiconductor chip. An outer supply wick structure may be disposed on the outerwall of the semiconductor chip to generate a third capillary force for supplying the coolant accommodated in the liquid phase inside the coolant storage portion to the supply channel.

The coolant storage portion may be formed by recessing the upper surface of the semiconductor chip. An outer supply wick structure may be disposed on a side wall of the coolant storage portion is configured to generate a third capillary force for supplying the coolant accommodated in the liquid phase inside the coolant storage portion to the supply channel.

The semiconductor chip may include a plurality of semiconductor chips. The cooling channel may include a plurality of cooling channels. Each of the plurality of semiconductor chips may respectively include a corresponding cooling channel of the plurality of cooling channels. The plurality of semiconductor chips may be stacked in the vertical direction. Each of the plurality of semiconductor chips except for a lowermost semiconductor chip may include a connection channel penetrating therethrough in the vertical direction. A connection wick structure may be disposed on at least a portion of a wall surface of the connection channel that is configured to move the coolant in the liquid phase by generating a second capillary force.

A semiconductor device may include: a semiconductor chip; a supply channel disposed on an upper surface of the semiconductor chip that is configured to move a coolant in liquid phase along the upper surface of the semiconductor chip by capillary action; a cooling channel formed by recessing the upper surface of the semiconductor chip, the cooling channel including: a bottom that is parallel to the upper surface and a side wall that connects the upper surface of the semiconductor chip and the bottom to each other; and a first wick structure disposed apart from the side wall of the cooling channel that is configured to supply the coolant in the liquid phase to the bottom of the cooling channel along the side wall of the cooling channel by capillary action.

The semiconductor device may further include a second wick structure configured to move the coolant along the bottom of the cooling channel by capillary action.

The second wick structure may be disposed apart from the bottom of the cooling channel.

The semiconductor device may further include a package housing enclosing the semiconductor chip. A supply opening may be disposed in the package housing to form a path for supplying the coolant in the liquid phase to the supply channel.

A discharge opening communicating with the cooling channel may be disposed in the package housing to discharge the coolant in vapor phase from the cooling channel when the coolant transitions from the liquid phase to the vapor phase in the cooling channel by absorbing heat from the semiconductor chip.

The supply opening and the discharge opening may be disposed apart from each other.

The semiconductor device may further include: a coolant storage portion configured to accommodate the coolant in the liquid phase and supply the coolant in the liquid phase to the cooling channel; and a package housing enclosing the semiconductor chip. The supply channel may include a supply wick structure that is disposed on the upper surface of the semiconductor chip and is configured to move the coolant in liquid phase along the upper surface of the semiconductor chip by capillary action. The supply channel may guide the coolant supplied in the liquid phase from the coolant storage portion to the cooling channel. The coolant storage portion may be disposed in the package housing.

BRIEF DESCRIPTION OF THE DRAWINGS

The above and other aspects, features, and advantages of certain embodiments will be more apparent from the following description taken in conjunction with the accompanying drawings, in which:

FIG. 1 is a view schematically illustrating a configuration of a semiconductor device according to an embodiment;

FIG. 7 is a view illustrating an example of simulation modeling for the liquid coolant moving capability of a normal wick structure and the liquid coolant moving capability of a suspended wick structure according to an embodiment;

FIG. 13 is a view schematically illustrating a configuration of a semiconductor device according to an embodiment;

FIG. 15 is a view schematically illustrating a configuration of a semiconductor device according to an embodiment.

DETAILED DESCRIPTION

Figure 2:
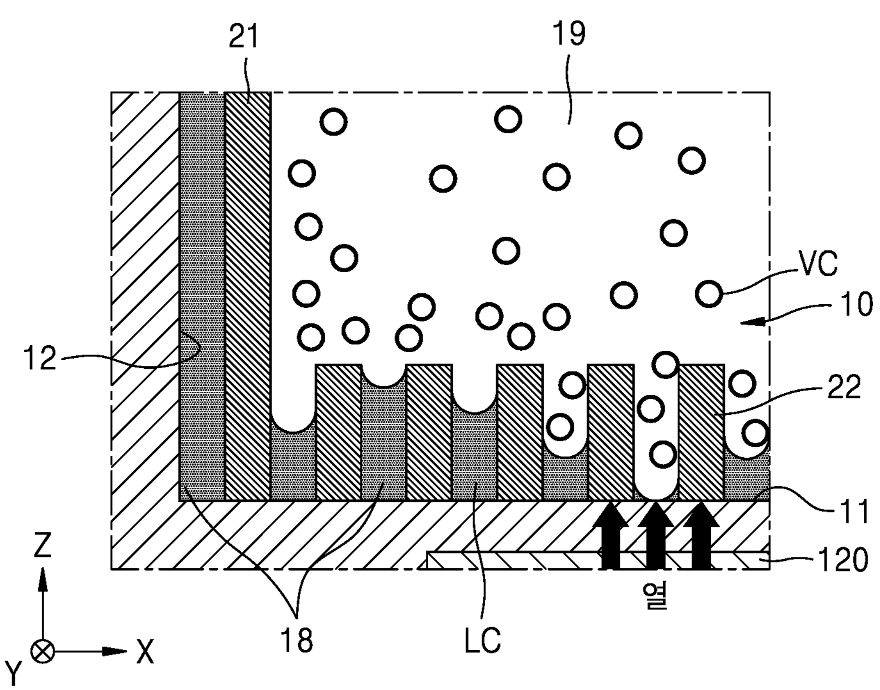
FIG. 2 is an enlarged view illustrating portion "A" of FIG. 1.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items.

Hereinafter, embodiments will be described with reference to the accompanying drawing. In the drawings, like reference numerals refer to like elements, and the sizes of elements may be exaggerated for clarity of illustration. The embodiments described herein are for illustrative purposes only, and various modifications may be made therein. In the following description, when an element is referred to as being "above" or "on" another element, it may be directly on an upper, lower, left, or right side of the other element while making contact with the other element or may be above an upper, lower, left, or right side of the other element without making contact with the other element. The terms of a singular form may include plural forms unless otherwise mentioned. It will be further understood that the terms "comprises" and/or "comprising" used herein specify the presence of stated features or elements, but do not preclude the presence or addition of one or more other features or elements. An element referred to with the definite article or a demonstrative determiner may be construed as the element or the elements even though it has a singular form. Operations of a method may be performed in an appropriate order unless explicitly described in terms of order or described to the contrary, and are not limited to the stated order thereof. As used herein, terms such as "unit" or "module" may be used to denote a unit that has at least one function or operation and is implemented with hardware, software, or a combination of hardware and software. Furthermore, line connections or connection members between elements depicted in the drawings represent functional connections and/or physical or circuit connections by way of example, and in actual applications, they may be replaced or embodied with various additional functional connections, physical connections, or circuit connections. Examples or exemplary terms are just used herein to describe technical ideas and should not be considered for purposes of limitation unless defined by the claims.

Efficient cooling systems are required to solve cooling problems acting as factors limiting the performance of electronic devices including semiconductor chips. In the fields of high-performance computing (HPC) and semiconductor devices including stacked 3D semiconductor chips, cooling systems are required to handle an increase in power density and an increase in the amount of heat generated by highly integrated circuits. To this end, a 2-phase cooling system capable of using the latent heat of vaporization of a coolant may be applied to semiconductor devices. Examples of 2-phase cooling methods include immersion cooling, spray cooling, and jet impingement cooling.

Immersion cooling is a method of cooling an electronic device by immersing the electronic device in a bath containing a liquid coolant. Although immersion cooling is most widely used, immersion cooling is limited to using dielectric coolants because electronic devices are immersed in liquid coolant. Therefore, immersion cooling incurs high maintenance costs and is not ecofriendly. In addition, cooling efficiency may decrease due to coolant vapor bubbles adsorbed on a heating surface of an electronic device. In a boiling graph, this phenomenon is called "critical heat flux (CHF)." An increase in CHF guarantees cooling for a higher heat flux.

Spray cooling is a method of atomizing a liquid coolant and spraying the atomized liquid coolant on a heating surface. Spray cooling guarantees high cooling efficiency compared to the amount of liquid coolant used. However, spray cooling devices require a pumping device capable of operating at high pressure and spray nozzles require regular maintenance and repair. In addition, when a film boiling phenomenon in which bubbles of vapor coolant are adsorbed on a heating surface occurs, the bubbles hinder heat transfer from the heating surface to the coolant, thereby reducing cooling efficiency.

Jet impingement cooling is a method of ejecting a liquid coolant on a heating surface at high speed. Although jet impingement cooling guarantees high cooling efficiency like spray cooling, jet impingement cooling requires multiple injectors for evenly cooling a heating surface. Moreover, blind spots may occur even when multiple injectors are used.

In a 2-phase cooling system of a semiconductor device, at least a portion of a cooling channel functioning as a path for a coolant is formed in a semiconductor chip to be cooled. For example, the cooling channel may be entirely formed in the semiconductor chip by recessing a surface (for example, an upper surface) of the semiconductor chip. A wick structure is provided on at least a portion of a wall surface of the cooling channel to generate capillary force for causing liquid coolant to flow. The wick structure may include a suspended wick structure that is apart from the wall surface of the cooling channel. For example, the suspended wick structure may be apart from a wall of the cooling channel by a capillary distance. The suspended wick structure causes a relatively large amount of coolant to flow compared to a wick structure extending from the wall surface of the cooling channel. Therefore, cooling performance may be improved.

A surface of the cooling channel may include a liquid channel region adjacent to the wall surface of the cooling channel on which the wick structure is formed and a vapor channel region in which the wick structure is not formed. The liquid channel region and the vapor channel region are not physically separated from each other but are distinguished by the presence or absence of the wick structure. Liquid coolant moves along the liquid channel region. The liquid coolant moving along the liquid channel region absorbs heat from a heating surface adjacent to a heating source and vaporizes into vapor coolant. Bubbles generated in the liquid channel region may move to the vapor channel region and may escape to the outside of the cooling channel along the vapor channel region. Liquid coolant is filled in a portion of the liquid channel region from which bubbles have escaped owing to capillary force generated by the wick structure. According to this configuration, because bubbles are easily separated from the heating surface, cooling efficiency may be improved, and the formation of hot spots may be reduced or prevented. In addition, the wick structure increases an area in which heat exchange occurs with liquid coolant, thereby facilitating heat exchange with the heat source. In addition, because liquid coolant flows along the liquid channel region by capillary force, a coolant supply device such as a high-capacity pump for supplying liquid coolant to the cooling channel is not required, thereby reducing manufacturing costs of the 2-phase cooling system and reducing power consumption.

Figure 1:
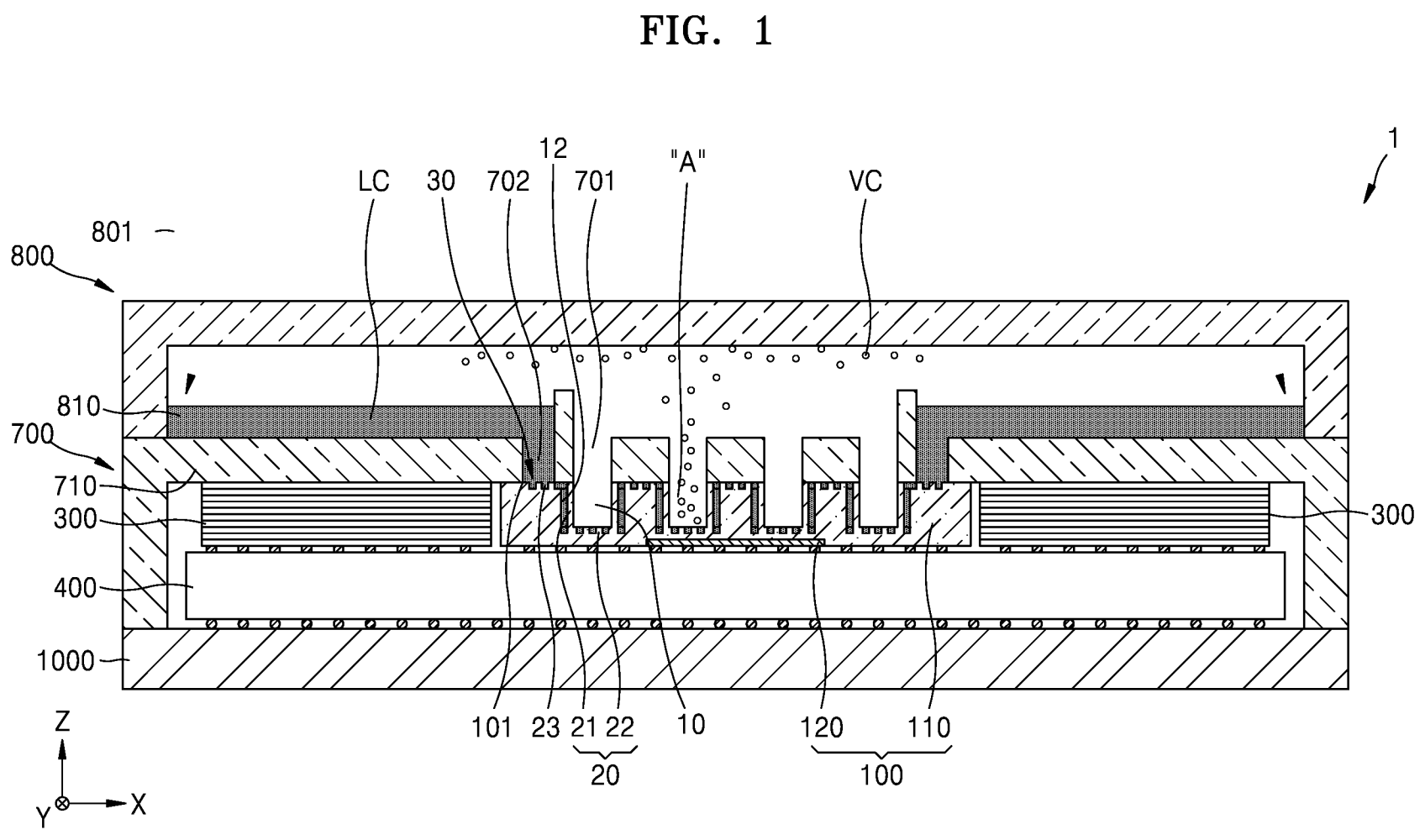

In the following description, a first direction X refers to one of directions parallel to the upper surface of a semiconductor chip. A second direction Z refers to the thickness direction of the semiconductor chip. A third direction Y refers to a direction orthogonal to the first direction X among directions parallel to the upper surface of the semiconductor chip. A vertical direction refers to the second direction Z, and horizontal directions refer to the first direction X and the third direction Y. FIG. 1 is a view illustrating a schematic configuration of a semiconductor device 1 according to an embodiment. FIG. 2 is an enlarged view illustrating portion "A" in FIG. 1.

Referring to FIGS. 1 and 2, the semiconductor device 1 of the embodiment may include a semiconductor chip 100 and a cooling channel 10. A liquid coolant LC may flow in the cooling channel 10 to absorb heat generated during operations of the semiconductor chip 100. A wick structure 20 may be provided on at least a portion of a wall surface of the cooling channel 10 to generate a capillary force and thus move the liquid coolant LC along the wall surface of the cooling channel 10. The wick structure 20 may include a suspended wick structure that is apart from the wall surface of the cooling channel 10 by a capillary distance.

The semiconductor chip 100 may include a substrate 110 and a semiconductor integrated circuit 120 formed on a surface of the substrate 110. An upper surface 101 of the semiconductor chip 100 may be an upper surface of the substrate 110, and the semiconductor integrated circuit 120 may be formed on a lower surface of the substrate 110. The semiconductor chip 100 may include various semiconductor integrated circuit chips. For example, the semiconductor chip 100 may include a memory chip including a memory integrated circuit or a logic chip including a logic integrated circuit such as a central processing unit (CPU) chip, a graphics processing unit (GPU) chip, or an application specific integrated circuit (ASIC) chip. When the semiconductor chip 100 is a wafer-level semiconductor integrated circuit chip, the semiconductor device 1 may have small form factors. The substrate 110 may be a wafer.

The semiconductor device 1 may include other semiconductor chips 300 that are two-dimensionally arranged with respect to the semiconductor chip 100. In the current embodiment, the semiconductor chips 300 are respectively arranged in the first direction X on both sides of the semiconductor chip 100. Although not shown in FIGS. 1 and 2, semiconductor chips 300 may also be arranged in the third direction Y respectively on both sides of the semiconductor chip 100. For example, the semiconductor chip 100 may be a logic chip, and the semiconductor chips 300 may be memory chips. For example, the semiconductor chips 300 may be high bandwidth memories (HBMs). The semiconductor chips 300 may include a plurality of HBMs stacked in the second direction Z.

A wiring layer may be provided on a lower surface of the semiconductor chip 100 to electrically connect the semiconductor integrated circuit 120 and a printed circuit board 1000 to each other. The wiring layer may be electrically passivated with respect to the outside. The semiconductor chip 100 and the semiconductor chips 300 may be mounted on the printed circuit board 1000 with an interposer 400 therebetween. The semiconductor chip 100 may be referred to as an integrated circuit die, and the semiconductor device 1 including the integrated circuit die may be referred to as an integrated circuit device.

At least a portion of the cooling channel 10 may be formed in the semiconductor chip 100, for example, in the substrate 110. In the current embodiment, the cooling channel 10 is formed by recessing the upper surface 101 of the semiconductor chip 100. The upper surface 101 of the semiconductor chip 100 is a surface opposite the semiconductor integrated circuit 120 among surfaces of the semiconductor chip 100 that are opposite each other in the second direction Z. The upper surface 101 of the semiconductor chip 100 may be the upper surface of the substrate 110. The cooling channel 10 may be formed by recessing the upper surface 101 of the semiconductor chip 100 toward the semiconductor integrated circuit 120. The cooling channel 10 includes a wall surface. The wall surface may include a bottom 11 and a side wall 12. The bottom 11 of the cooling channel 10 may be parallel to the upper surface 101 of the semiconductor chip 100. The bottom 11 of the cooling channel 10 may be a surface adjacent to the semiconductor integrated circuit 120. The bottom 11 may be a surface extending in horizontal directions, that is, in the first and third directions X and Y. The side wall 12 may extend from the bottom 11 toward the upper surface 101 of the semiconductor chip 100 and connect the upper surface 101 of the semiconductor chip 100 and the bottom 11 to each other. The side wall 12 may be a surface extending from the bottom 11 in the vertical direction, that is, in the second direction Z.

The semiconductor chip 100 and the semiconductor chips 300 may be packaged using a package housing 700. The package housing 700 may surround at least a portion of the semiconductor chip 100. The package housing 700, for example, an upper wall 710 of the package housing 700, may include: a discharge opening 701 that communicates with the cooling channel 10 for discharging vapor coolant VC when liquid coolant LC absorbs heat from the semiconductor chip 100 and vaporizes in the cooling channel 10; and a supply opening 702 configured to supply liquid coolant LC to the cooling channel 10. An area onto which the discharge opening 701 is projected in the second direction Z may be within an area onto which the cooling channel 10 is projected in the second direction Z. The discharge opening 701 and the supply opening 702 may be apart from each other. When a plurality of cooling channels 10 are provided in the semiconductor chip 100, a plurality of discharge openings 701 respectively corresponding to the cooling channels 10 may be provided in the package housing 700.

The discharge opening 701 is connected to a condenser 800. The supply opening 702 is connected to a coolant storage portion 810 in which liquid coolant LC to be supplied to the cooling channel 10 is contained. In the current embodiment, the coolant storage portion 810 is provided outside the package housing 700. When the condenser 800 serves as the coolant storage portion 810, the discharge opening 701 and the supply opening 702 may be connected to the condenser 800. In the current embodiment, the condenser 800 and the coolant storage portion 810 are disposed on the upper wall 710 of the package housing 700. Although not shown in FIG. 1, the condenser 800 and the coolant storage portion 810 may be provided apart from the package housing 700. In this case, the discharge opening 701 may be connected to the condenser 800 through a connection member (not shown) such as a pipe, and the supply opening 702 may be connected to the coolant storage portion 810 through a connection member (not shown) such as a pipe. A plurality of cooling fins 801 may be arranged on an outer wall of the condenser 800. A cooling fan (not shown) may supply cooling air to the cooling fins 801 of the condenser 800.

Vapor coolant VC may move to the condenser 800 through the discharge opening 701 and may condense into liquid coolant LC by exchanging heat with ambient air at the condenser 800. The liquid coolant LC is accommodated in the coolant storage portion 810. The coolant storage portion 810 communicates with the supply opening 702. The liquid coolant LC may be supplied to the cooling channel 10 through the supply opening 702.

The wick structure 20 may be provided on at least a portion of the wall surface of the cooling channel 10. The wick structure 20 may include a first wick structure 21 that is apart from the side wall 12 of the cooling channel 10 and configured to supply liquid coolant LC to the bottom 11 of the cooling channel 10 along the side wall 12 of the cooling channel 10. The first wick structure 21 forms a capillary channel (first vertical capillary channel) through which coolant is moved in the vertical direction by capillary force. The first wick structure 21 may be a suspended wick structure that is apart from the side wall 12 toward the inside of the cooling channel 10 by a capillary distance. The capillary distance is determined such that capillary force may be generated between the first wick structure 21 and the side wall 12. Therefore, another capillary channel (second vertical capillary channel) for moving a coolant in the vertical direction may be formed between the first wick structure 21 and the side wall 12.

The liquid coolant LC supplied to the inside of the package housing 700 through the supply opening 702 may flow along the upper surface 101 of the semiconductor chip 100 toward the side wall 12 of the cooling channel 10. The liquid coolant LC may be moved along the side wall 12 of the cooling channel 10 in the direction opposite the second direction Z by the capillary force generated by the first wick structure 21 and may be supplied to the bottom 11 of the cooling channel 10.

For example, a capillary force in a pipe having a wick may be expressed by Equation 1 below. In Equation 1, $\Delta P_c$ refers to a capillary force, a refers to a surface tension, and $r_c$ refers to a capillary radius.

$$\Delta P_c = 2\frac{\sigma}{r_c} \qquad \text{Equation 1}$$

At a capillary limit, the capillary force is equivalent to $\Delta P_L$ that is a pressure for moving a coolant through the wick. According to Darcy's law, APL may be calculated by Equation 2 below. In Equation 2, $\mu_L$ refers to a dynamic viscosity of the coolant, $L_{eff}$ refers to an effective length of the pipe, K refers to a permeability of the wick, $A_w$ refers to a cross-sectional area of the wick, and V refers to a volume flow rate.

$$\Delta P_L = \frac{\mu_L L_{eff}}{K A_w} V \qquad \text{Equation 2}$$

Here, the volume flow rate V may be calculated by Equation 3 below. In Equation 3, Q refers to a heat transfer rate, ρ refers to a density of the coolant, and $\Delta H_{vap}$ refers to latent heat of vaporization.

$$V = \frac{Q}{\Delta H_{vap}\rho} \qquad \text{Equation 3}$$

Equation 4 below may be derived from Equations 1, 2, and 3.

$$Q = 2\frac{K A_w \Delta H_{vap} \rho \sigma}{\mu_L L_{eff} r_c} \qquad \text{Equation 4}$$

An appropriate capillary radius $r_c$ may be calculated using Equation 4 by considering the amount of heart generated by the semiconductor chip 100. Form factors of the first wick structure 21 and a capillary distance may be determined based on the calculated capillary radius $r_c$.

Figure 3A:
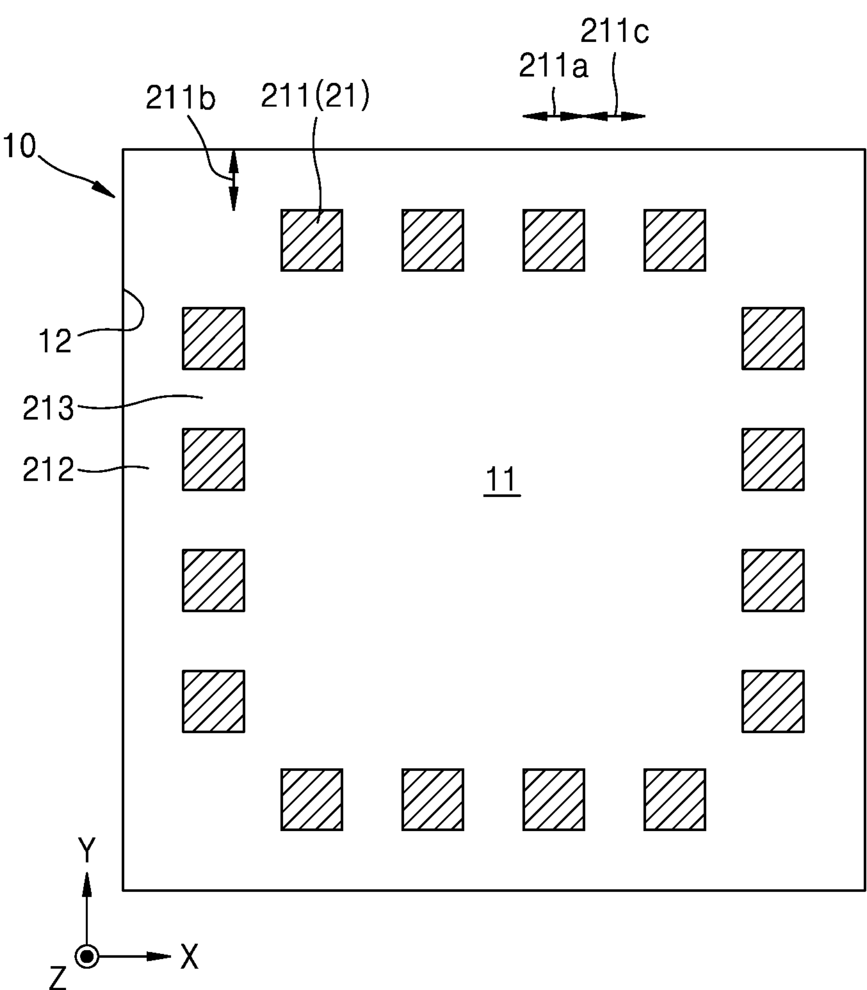
FIGS. 3A to 3C are plan views schematically illustrating various examples of a cooling channel and a first wick structure.
Figure 3B:
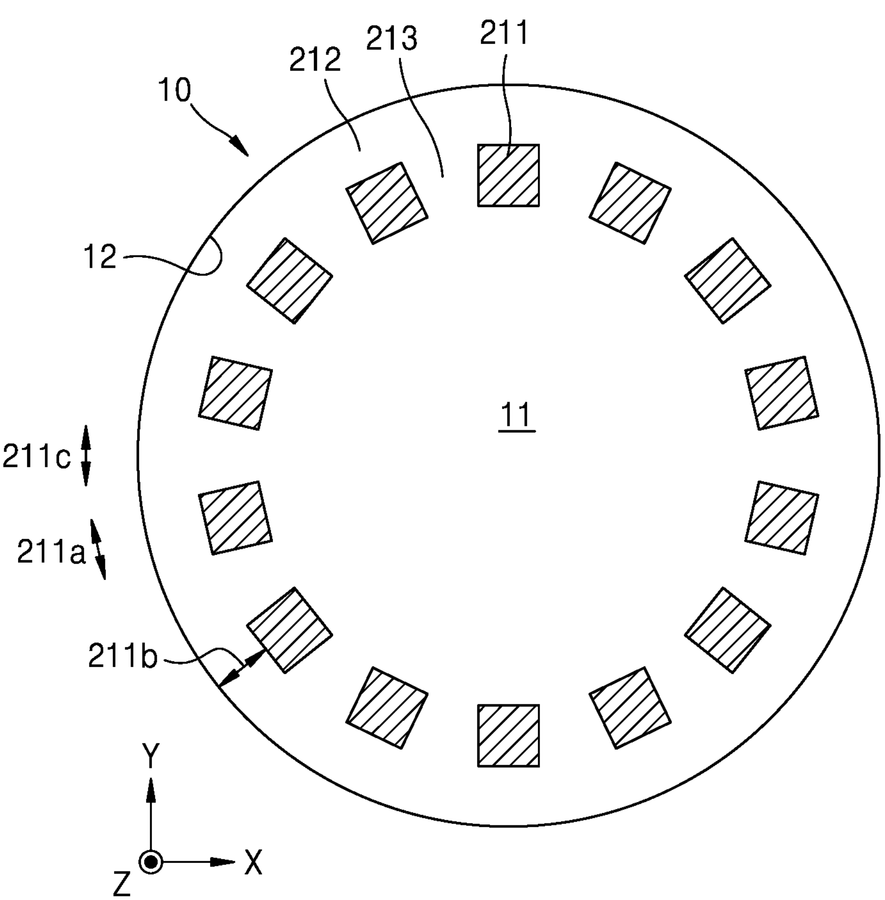
Figure 3C:
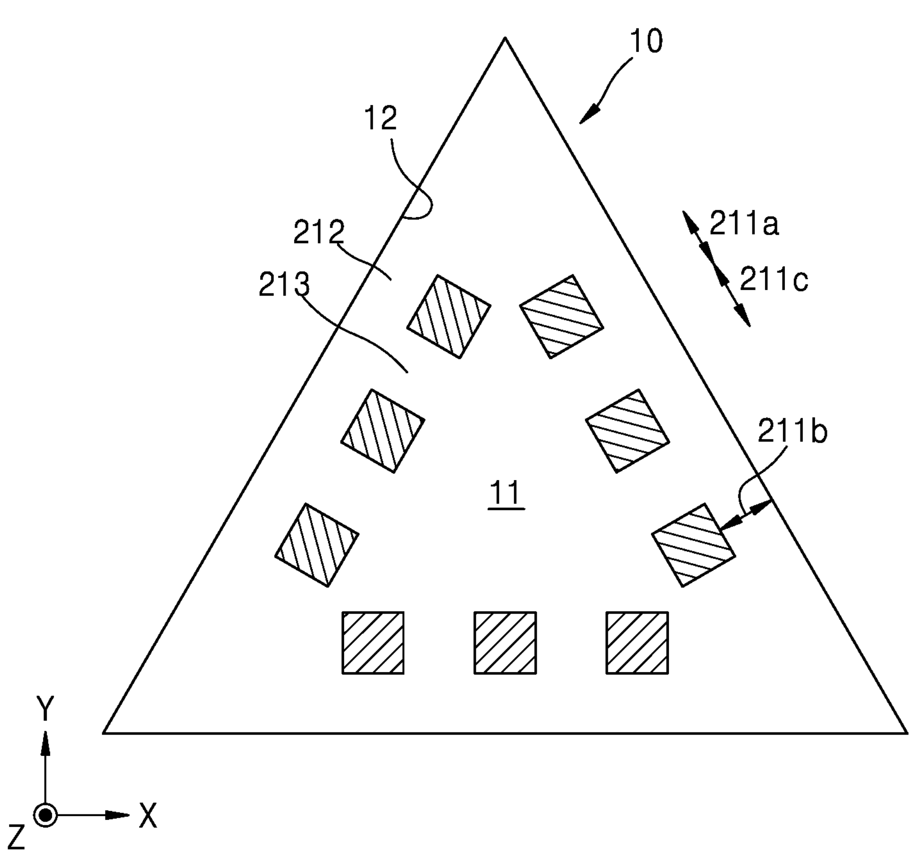

FIGS. 3A to 3C are schematic plan views illustrating various examples of the cooling channel 10 and the first wick structure 21. For ease of description, the size of the first wick structure 21 is exaggerated in FIGS. 3A to 3C. A second wick structure 22 (described later) is omitted in FIGS. 3A to 3C. Referring to FIGS. 3A to 3C, for example, the cooling channel 10 may have a square shape (FIG. 3A), a circular shape (FIG. 3B), or a triangular shape (FIG. 3C). The first wick structure 21 may include a plurality of ridges 211 that are positioned a capillary distance away from the side wall 12 of the cooling channel 10 toward the inside of the cooling channel 10. For example, the cross-sectional shape of the ridges 211 in a horizontal direction may be a square. The ridges 211 may extend from the bottom 11 of the cooling channel 10 in the second direction Z. The ridges 211 may extend to positions adjacent to the upper surface 101 of the semiconductor chip 100.

In FIG. 3A, the ridges 211 are apart from four side walls 12 of the cooling channel 10. The ridges 211 are arranged apart from each other at intervals in the first direction X or the third direction Y. In FIG. 3B, the ridges 211 are apart from a circular side wall 12 of the cooling channel 10. The ridges 211 are apart from each other at intervals in a circumferential direction. In FIG. 3C, the ridges 211 are apart from three side walls 12 of the cooling channel 10. The ridges 211 are arranged apart from each other along the three side walls 12. Referring to each of FIGS. 3A to 3C, first vertical capillary channels 213 are formed between the ridges 211, and a second vertical capillary channel 212 is formed between the ridges 211 and the side wall(s) 12.

A length 211*a* of a side of each of the ridges 211 and a distance 211*b* from the side wall 12 to the ridges 211 may be defined as a capillary distance allowing the generation of capillary force in the second vertical capillary channel 212. In other words, the cross-sectional area of the second vertical capillary channel 212 is defined by the length 211*a* of one side of the ridges 211 and the distance 211*b* from the side wall 12. The length 211*a* of one side of the ridges 211 and the distance 211*b* from the side wall 12 may be determined such that the radius of a circle equivalent to the cross-sectional area of the second vertical capillary channel 212 may satisfy a capillary radius $r_c$ calculated by Equations 1 to 4. For example, when the cross-sectional shape of the ridges 211 in the horizontal direction is a square, the distance 211*b* of the ridges 211 from the side wall 12 may be twice the capillary radius $r_c$.

The length 211*a* of one side of each of the ridges 211 and the distance 211*c* between the ridges 211 may be determined such that capillary force may be generated in the first vertical capillary channels 213. In other words, the cross-sectional area of each of the first vertical capillary channels 213 may be defined by the length 211*a* of one side of each of the ridge 211 and the distance 211*c* between the ridges 211. The length 211*a* of one side of each of the ridges 211 and the distance 211*c* between the ridges 211 may be determined such that the radius of a circle equivalent to the cross-sectional area of each of the first vertical capillary channels 213 may satisfy a capillary radius $r_c$ calculated by Equations 1 to 4.

Therefore, the first vertical capillary channels 213 and the second vertical capillary channel 212 may form capillary paths through which liquid coolant LC flows. The liquid coolant LC may be moved by capillary force along the first vertical capillary channels 213 and the second vertical capillary channel 212.

Various examples of the cooling channel 10 shown in FIGS. 3A to 3C are merely non-limiting examples. For example, the cross-sectional shape of the cooling channel 10 in a horizontal direction is not limited to a triangular shape, a tetragonal shape, or a circular shape, but may be selected from various polygonal shapes, elliptical shapes, and other irregular shapes. In addition, when a plurality of cooling channels 10 are formed in the semiconductor chip 100, for example, in the substrate 110, the cross-sectional shapes of the cooling channels 10 in a horizontal direction do not all need to be the same. Besides the cross-sectional shapes shown in FIGS. 3A to 3C, the first wick structure 21 may have various other cross-sectional shapes and arrangements as long as the first wick structure 21 is capable of generating capillary force to move liquid coolant LC. For example, the cross-sectional shape of the ridges 211 in a horizontal direction may be any of various polygonal shapes such as triangular shapes and tetragonal shapes, partial circular shapes, and partial elliptical shapes as long as capillary force is generated by the ridges 211. In addition, the ridges 211 do not all need to have the same cross-sectional shape in the vertical direction. That is, the first wick structure 21 may include two or more ridges 211 having different cross-sectional shapes in the vertical direction.

Figure 4A:
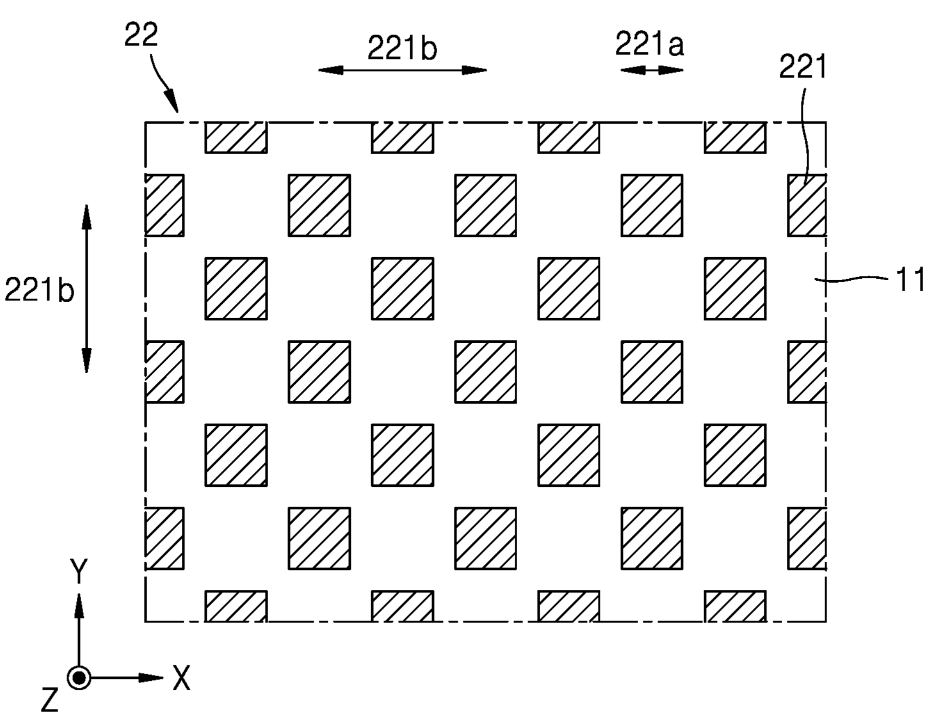
FIGS. 4A to 4C are plan views schematically illustrating various examples of a second wick structure.
Figure 4B:
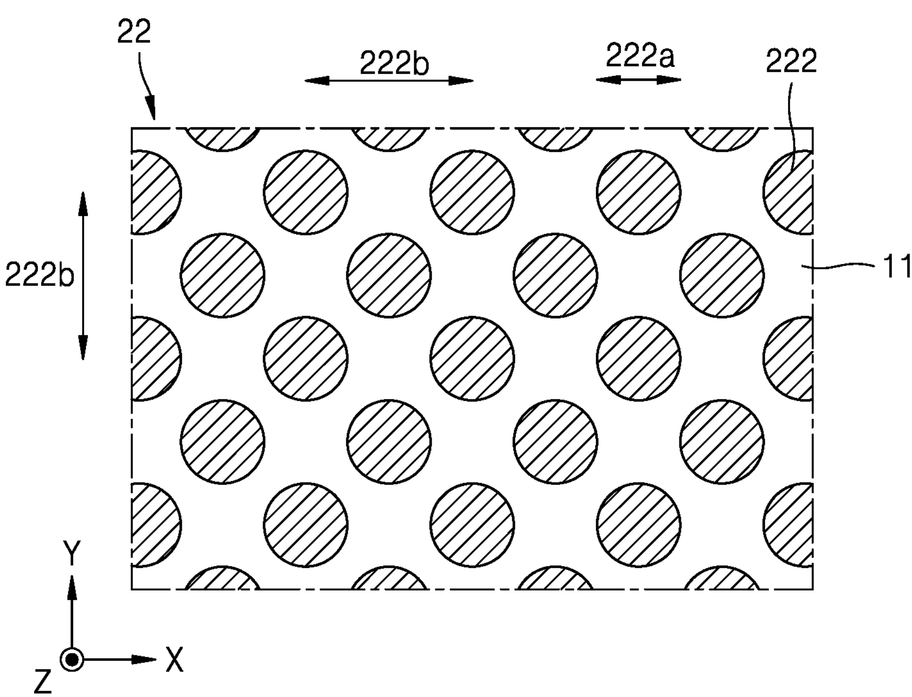
Figure 4C:
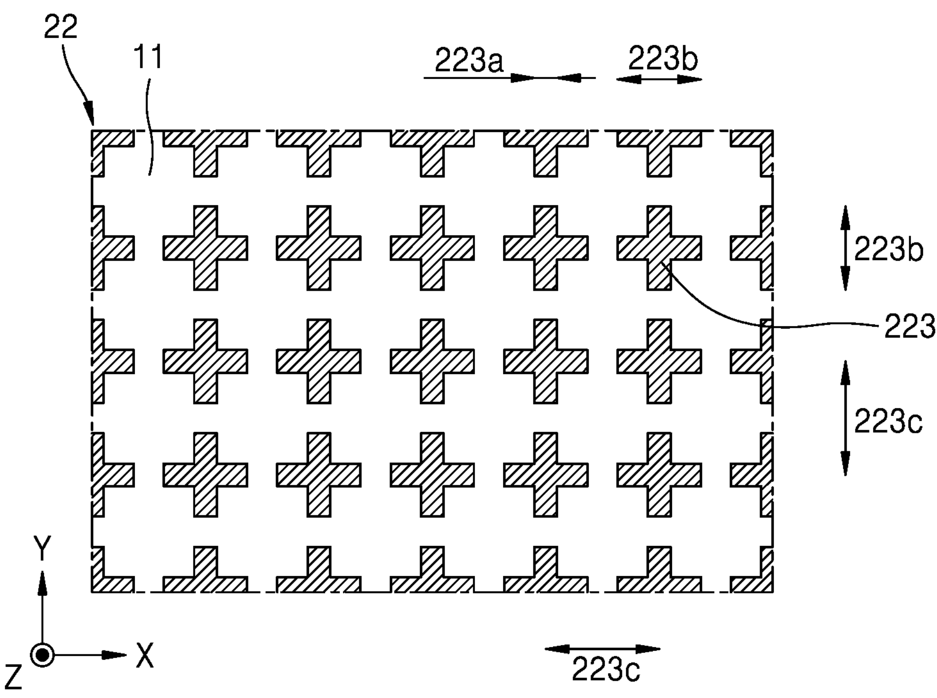

Referring back to FIGS. 1 and 2, the wick structure 20 may include a second wick structure 22 provided on the bottom 11 of the cooling channel 10. The second wick structure 22 may generate capillary force to horizontally move coolant along the bottom 11 of the cooling channel 10. FIGS. 4A to 4C are plan views schematically illustrating various examples of the second wick structure 22. Referring to FIGS. 4A to 4C, the second wick structure 22 may include a plurality of fine protrusions 221, 222, or 223 that are two-dimensionally arranged in horizontal directions, that is, in the first direction X and the third direction Y. The fine protrusions 221, 222, and 223 may protrude from the bottom 11 of the cooling channel 10 in the second direction Z.

Referring to FIG. 4A, the fine protrusions 221 have a square cross-sectional shape in a horizontal direction. The fine protrusions 221 are arranged at equal intervals in the first direction X and the third direction Y. Liquid coolant LC is moved by capillary force into a space (first horizontal capillary channel) between two adjacent fine protrusions 221. The height of each of the fine protrusions 221, a length 221*a* of one side of each of the fine protrusions 221, and distances 221*b* between the fine protrusions 221 in the first direction X and the second direction Y may be determined such that the radius of a circle equivalent to the cross-sectional area of a space (first horizontal capillary channel) between two adjacent fine protrusions 221 may satisfy a capillary radius $r_c$ calculated by Equations 1 to 4.

Referring to FIG. 4B, the cross-sectional shape of the fine protrusions 222 in a horizontal direction is circular. The fine protrusions 222 are arranged at equal intervals in the first direction X and the third direction Y. Liquid coolant LC is moved by capillary force into a space (first horizontal capillary channel) between two adjacent fine protrusions 222. The height of each of the fine protrusions 222, a radius 222*a* of each of the fine protrusions 222, and distances 222*b* between the fine protrusions 222 in the first direction X and the second direction Y may be determined such that the radius of a circle equivalent to the cross-sectional area of a space (first horizontal capillary channel) between two adjacent fine protrusions 221 may satisfy a capillary radius $r_c$ calculated by Equations 1 to 4.

Referring to FIG. 4C, the fine protrusions 223 have a cross-shaped cross-section. The fine protrusions 223 are arranged at equal intervals in the first direction X and the third direction Y. Liquid coolant LC is moved by capillary action into a space (first horizontal capillary channel) between two adjacent fine protrusions 223. The height of each of the fine protrusions 223, a line width 223*a* of each of the fine protrusions 223, and widths 223*b* of the fine protrusions 223 in the first direction X and the second direction Y, and distances 223*c* between the fine protrusions 223 in the first direction X and the second direction Y may be determined such that the radius of a circle equivalent to the cross-sectional area of a space (first horizontal capillary channel) between two adjacent fine protrusions 223 may satisfy a capillary radius $r_c$ calculated by Equations 1 to 4.

The various examples of the second wick structure 22 shown in FIGS. 4A to 4C are merely non-limiting examples, and the second wick structure 22 may have various cross-sectional shapes and arrangements as long as the second wick structure 22 is capable of generating capillary force to move liquid coolant LC. For example, the cross-sectional shape of the fine protrusions 223 of the second wick structure 22 in a horizontal direction may be any of various polygonal shapes such as triangular shapes and tetragonal shapes, circular shapes, partial circular shapes, and partial elliptical shapes as long as the fine protrusions 223 of the second wick structure 22 may generate capillary force. In addition, the cross-sectional shape of the fine protrusions 223 of the second wick structure 22 in the vertical direction may be any of various polygonal shapes such as triangular shapes and tetragonal shapes, circular shapes, partial circular shapes, and partial elliptical shapes as long as the fine protrusions 223 of the second wick structure 22 may generate capillary force. In addition, the fine protrusions 223 of the second wick structure 22 do not all need to have the same cross-sectional shape in the vertical direction. That is, the second wick structure 22 may include two or more fine protrusions 223 having different cross-sectional shapes in the vertical direction.

Referring back to FIG. 2, a path (liquid channel region) 18 for liquid coolant LC is formed in an internal region of the cooling channel 10 in which the wick structure 20, for example, the first wick structure 21 and the second wick structure 22, is formed. A path (vapor channel region) 19 for vapor coolant VC is formed in another internal region of the cooling channel 10 in which the wick structure 20, for example, the first wick structure 21 and the second wick structure 22, is not formed. The liquid channel region 18 is adjacent to the bottom 11 and the side wall 12 of the cooling channel 10. Therefore, liquid coolant LC is moved by capillary force along the liquid channel region 18 that is adjacent to the side wall 12 and the bottom 11. The vapor channel region 19 is an internal region of the cooling channel 10 that is apart from the bottom 11 and the side wall 12 of the cooling channel 10. The liquid channel region 18 and the vapor channel region 19 communicate with each other.

Liquid coolant LC is supplied from the coolant storage portion 810 to the cooling channel 10 through the supply opening 702. The liquid coolant LC moves in the liquid channel region 18 along the wall surface of the cooling channel 10. In other words, the liquid coolant LC is moved to the bottom 11 of the cooling channel 10 along the side wall 12 of the cooling channel 10 by the first wick structure 21, and covers the bottom 11 of the cooling channel 10 as being moved along the bottom 11 of the cooling channel 10 by the second wick structure 22. The liquid coolant LC may be heated by absorbing heat from the semiconductor integrated circuit 120 and may be changed into vapor coolant VC. The vapor coolant VC moves from the liquid channel region 18 to the vapor channel region 19, and then moves to the condenser 800 through the discharge opening 701. The vapor coolant VC condenses into liquid coolant LC by exchanging heat with the outside of the condenser 800, and the liquid coolant LC is accommodated in the coolant storage portion 810.

Figure 5:
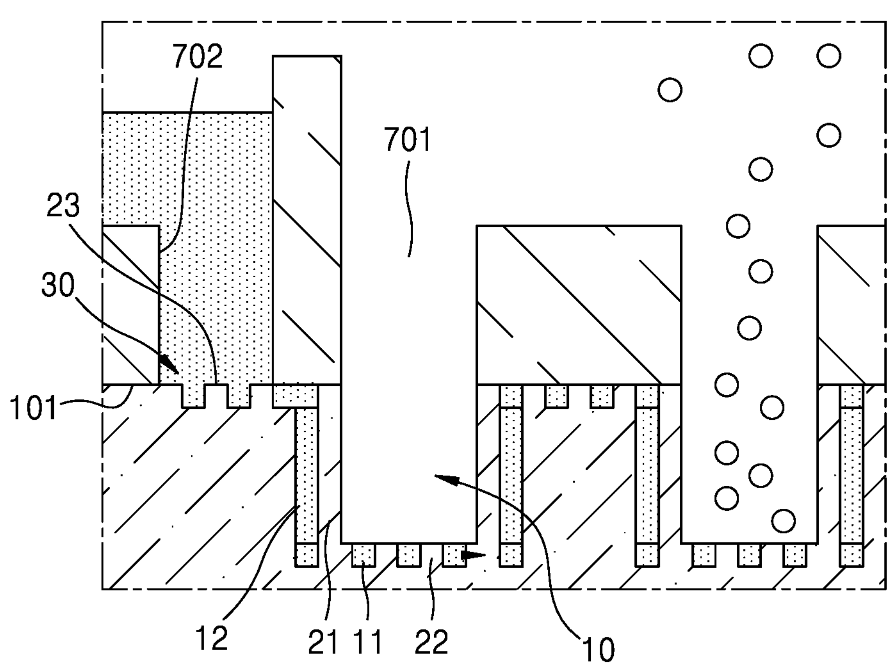
FIG. 5 is a cross-sectional view schematically illustrating a supply channel according to an embodiment.

FIG. 5 is a cross-sectional view schematically illustrating a supply channel 30 according to an embodiment. Referring to FIGS. 1 and 5, the semiconductor device 1 may further include the supply channel 30. The supply channel 30 may guide a coolant stored in the coolant storage portion 810 to the cooling channel 10. In the current embodiment, the supply channel 30 connects the supply opening 702 and the cooling channel 10 to each other. The supply channel 30 is provided on the upper surface 101 of the semiconductor chip 100, and liquid coolant LC supplied through the supply opening 702 is guided by the supply channel 30 along the upper surface 101 of the semiconductor chip 100 to the cooling channel 10. The supply channel 30 may be formed between the package housing 700 and the upper surface 101 of the semiconductor chip 100, for example, the upper surface of the substrate 110. The supply channel 30 may have a supply wick structure 23 configured to generate capillary force for moving liquid coolant LC along the upper surface 101 of the semiconductor chip 100. For example, the supply wick structure 23 may be provided on the upper surface 101 of the semiconductor chip 100, for example, on the upper surface of the substrate 110. Therefore, liquid coolant LC introduced into the supply channel 30 from the coolant storage portion 810 through the supply opening 702 may be moved along the supply channel 30 by capillary force, and thus the liquid coolant LC may be effectively supplied to the liquid channel region 18 of the cooling channel 10. The supply channel 30 may be formed in a region of the upper surface 101 of the semiconductor chip 100 that is connected to at least a portion of the cooling channel 10. The supply channel 30 may be formed in a region of the upper surface 101 of the semiconductor chip 100 that surrounds the cooling channel 10. The supply channel 30 may be formed entirely on the upper surface 101 of the semiconductor chip 100. Therefore, liquid coolant LC may be effectively supplied to the cooling channel 10. In addition, heat generated by the semiconductor chip 100 may be absorbed by the liquid coolant LC in the supply channel 30.

The supply wick structure 23 may be the same as the second wick structure 22. For example, the second wick structure 22 may include unit patterns having the same shapes, sizes, and spacings as the shapes, sizes, and spacings of unit patterns of the supply wick structure 23. For example, the second wick structure 22 and the supply wick structure 23 may be formed by two-dimensionally arranging square unit patterns in horizontal directions. However, the shapes and sizes of the unit patterns of the second wick structure 22 and the supply wick structure 23 do not necessarily need to be identical to each other. When the second wick structure 22 and the supply wick structure 23 are identical to each other, the semiconductor chip 100 may be manufactured through simple processes. For example, the cooling channel 10 concave from the upper surface of the substrate 110 of the semiconductor chip 100 in the vertical direction, that is, in the second direction Z, and the first wick structure 21 extending from the bottom 11 of the cooling channel 10 in the second direction Z and apart from the side wall 12 of the cooling channel 10 may be formed by etching the upper surface of the substrate 110 of the semiconductor chip 100. Then, the second wick structure 22 and the supply wick structure 23 may be simultaneously formed by etching or laser-ablating the upper surface of the substrate 110 and the bottom 11 of the cooling channel 10.

Figure 6:
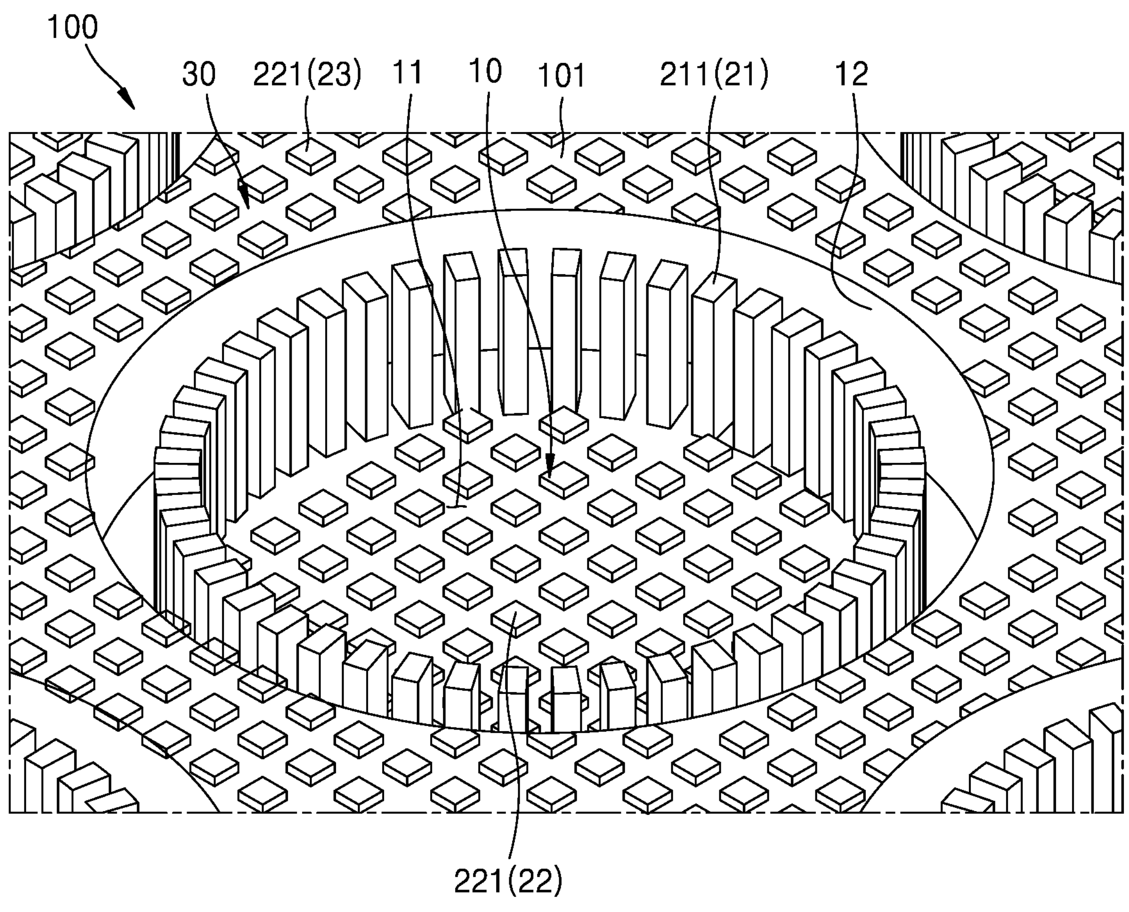
FIG. 6 is a partial perspective view illustrating a semiconductor chip according to an embodiment.

FIG. 6 is a partial perspective view illustrating the semiconductor chip 100 according to an embodiment. Referring to FIG. 6, a plurality of cooling channels 10 are formed by recessing the upper surface 101 of the semiconductor chip 100, for example, the upper surface of the substrate 110. The cooling channels 10 are arranged apart from each other. For example, the cooling channels 10 may be apart from each other in the first direction X and/or the third direction Y. For example, the cross-sectional shape of the cooling channels 10 in a horizontal direction may be circular. A first wick structure 21 is formed by a plurality of ridges 211 arranged apart from a side wall 12 of each of the cooling channels 10. The ridges 211 are arranged at intervals in a circumferential direction of each of the cooling channels 10. For example, the cross-sectional shape of each of the ridges 211 in the horizontal direction is a square. The ridges 211 extend from a bottom 11 of each of the cooling channels 10 to positions adjacent to the upper surface 101 of the semiconductor chip 100 in the second direction Z. A second wick structure 22 is formed by a plurality of fine protrusions 221 that protrude from the bottom 11 of each of the cooling channels 10 and are two-dimensionally arranged in the horizontal direction. For example, the cross-sectional shape of the fine protrusions 221 in the horizontal direction is a square. A supply channel 30 entirely surrounding the cooling channels 10 is provided on the upper surface 101 of the semiconductor chip 100, for example, on the upper surface of the substrate 110. A supply wick structure 23 is provided in the supply channel 30. For example, the supply wick structure 23 is the same as the second wick structure 22.

In the semiconductor device 1, liquid coolant LC introduced into the supply channel 30 through the supply opening 702 from the coolant storage portion 810 may be stably supplied to the cooling channels 10 along the supply channel 30 owing to capillary force formed by the supply wick structure 23. Therefore, the liquid coolant LC may be continuously and sufficiently supplied to the cooling channels 10. The liquid coolant LC may be supplied by capillary force to a location close to a heat source located inside the semiconductor chip 100 along the liquid channel region 18 formed by the first and second wick structures 21 and 22, and thus, the semiconductor chip 100 may be effectively cooled. Vapor coolant VC generated as the liquid coolant LC vaporizes near the heat source may escape to the vapor channel region 19. Therefore, the vapor coolant VC may not be stagnant in the liquid channel region 18. Owing to capillary force generated by the first and second wick structures 21 and 22, liquid coolant LC may be rapidly introduced from the surroundings into an empty space of the liquid channel region 18 from which the vapor coolant VC has escaped. Therefore, the liquid channel region 18 may be filled with liquid coolant LC without any empty space. The vapor coolant VC may be moved to the condenser 800 through the vapor channel region 19. Therefore, because liquid coolant LC is quickly and continuously supplied to the periphery of the heat source, thermal resistance may be reduced near the heat source. In other words, the formation of a vapor film on surfaces of the cooling channels 10 near the heat source may be reduced or eliminated, thereby uniformly maintaining cooling performance, suppressing the formation of hot spots, and effectively dissipating heat.

In addition, because liquid coolant LC is moved owing to capillary force generated by the first and second wick structures 21 and 22, a pump or similar devices for moving liquid coolant LC may be omitted, and thus the energy consumption of a cooling system may be reduced. Because the area of a heat transfer surface is increased by the first and second wick structures 21 and 22, the efficiency of heat transfer from the semiconductor chip 100 to coolant may be improved, and bubbles of vapor coolant VC may be effectively removed from the heat transfer surface, thereby improving CHF performance.

Liquid coolant LC is moved along the liquid channel region 18 owing to capillary force generated by the first and second wick structures 21 and 22. Liquid coolant LC may not be present in the vapor channel region 19. Therefore, vapor coolant VC may be effectively discharged to the outside of the semiconductor chip 100 along the vapor channel region 19. However, liquid coolant LC may be present in a portion of the vapor channel region 19 due to disturbance such as vibration.

In addition, because liquid coolant LC is moved by capillary force, liquid coolant LC may not be affected by the orientation of the semiconductor chip 100. In other words, even when the semiconductor device 1 shown in FIG. 1 is applied to an electronic device in an oblique state or an upside-down state, the liquid channel region 18 and the vapor channel region 19 may remain intact, thereby allowing liquid coolant LC to move along the liquid channel region 18 and vapor coolant VC to move along the vapor channel region 19.

Owing to the first wick structure 21 having a suspended wick form, a larger amount of liquid coolant LC may be stably supplied to the bottom 11 of the cooling channel 10. FIG. 7 illustrates an example of simulation modeling for the liquid coolant LC moving capability of a normal wick structure and the liquid coolant LC moving capability of a suspended wick structure according to an embodiment. FIG. 7 illustrates generally cylindrical cooling channels. The normal wick structure extends inward from a side wall of a cooling channel. In the modeling, a wick length is 100 μm. Wick spacing, that is, the width of each capillary channel is 50 μm. The suspended wick structure is positioned 50 μm apart from a side wall of a cooling channel and extends 50 μm inward. Wick spacing, that is, the width of each capillary channel is 50 μm.

Figure 8:
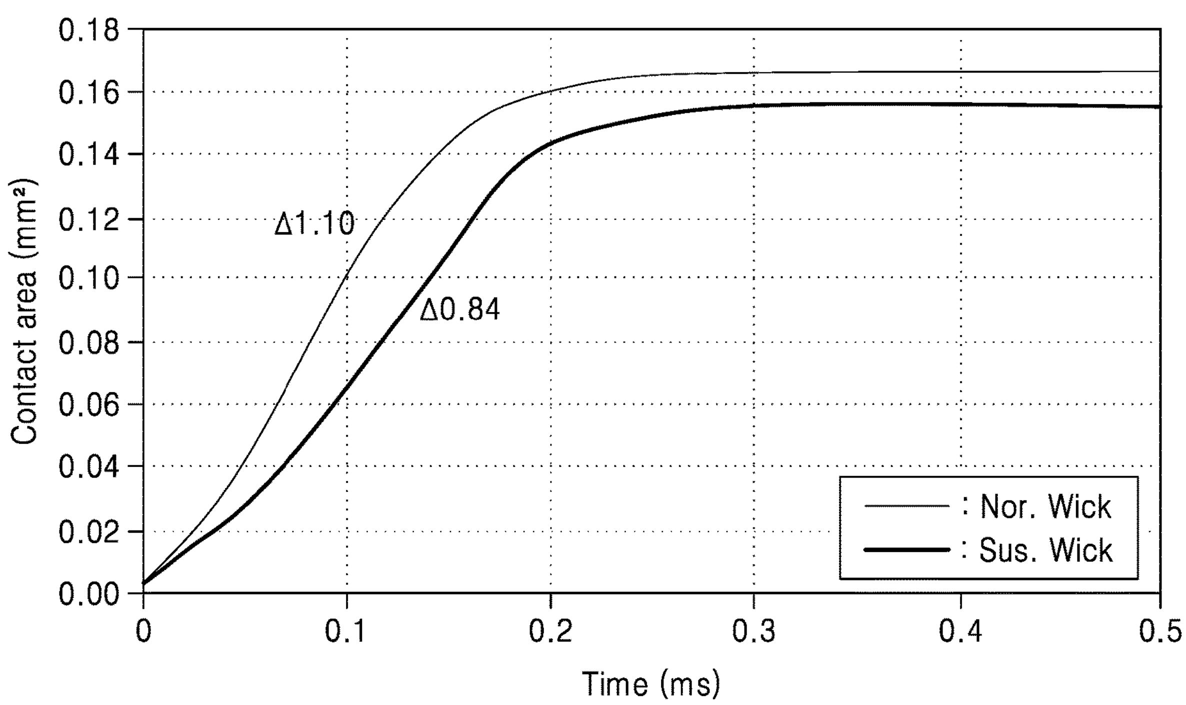
FIG. 8 is a graph illustrating simulation results regarding liquid velocities in the normal wick structure and the suspended wick structure shown in FIG. 7.
Figure 9:
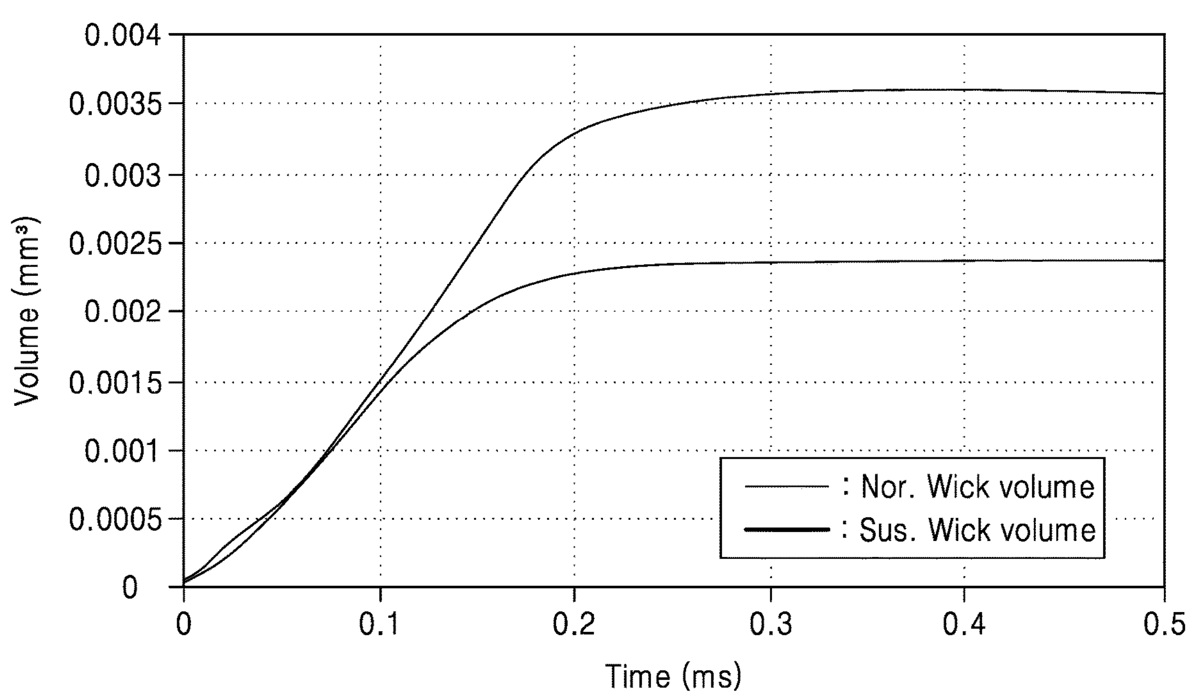
FIG. 9 is a graph illustrating simulation results regarding the amounts of liquid movement in the normal wick structure and the suspended wick structure shown in FIG. 7.

FIG. 8 illustrates simulation results regarding liquid velocities in the normal wick structure and the suspended wick structure that are shown in FIG. 7. FIG. 9 illustrates simulation results regarding the amounts of liquid moving in the normal wick structure and the suspended wick structure that are shown in FIG. 7. Referring to FIG. 8, the liquid velocity in the normal wick structure is about 1.3 times the liquid velocity in the suspended wick structure. Referring to FIG. 9, the amount of liquid moving in the suspended wick structure is 1.25 times the amount of liquid moving in the normal wick structure. The reason for this is that although the capillary spacing of the suspended wick structure is maintained, the cross-sectional area of each capillary channel of the suspended wick structure is greater than the cross-sectional area of each capillary channel of the normal wick structure. That is, although the normal wick structure forms only the first vertical capillary channels 213 described above, the suspended wick structure forms both the first and second vertical capillary channels 213 and 212 described above. Therefore, the amount of heat that the suspended wick structure is capable of handling is about 1.25 times the amount of heat that the normal wick structure is capable of handling.

In addition, the cooling channel 10, the first and second wick structures 21 and 22, and the supply wick structure 23 are formed on the semiconductor chip 100, for example, on the substrate 110 of the semiconductor chip 100. The substrate 110 is a wafer on which the semiconductor integrated circuit 120 is formed through semiconductor processes. After the semiconductor integrated circuit 120 is formed on a surface of the substrate 110, for example, the lower surface (or active surface) of the substrate 110 through semiconductor processes, the cooling channel 10 may be formed by recessing the other surface of the substrate 110, for example, the upper surface (or non-active surface) of the substrate 110 through a semiconductor process such as an etching process. In addition, the first and second wick structures 21 and 22 and the supply wick structure 23 may be formed on the wall surface of the cooling channel 10 and the upper surface of the substrate 110 through semiconductor processes such as etching and laser ablation. As described above, a structure for 2-phase cooling may be formed during manufacturing processes of the semiconductor chip 100, and thus, the semiconductor device 1 having a 2-phase cooling structure may be easily manufactured.

Figure 10:
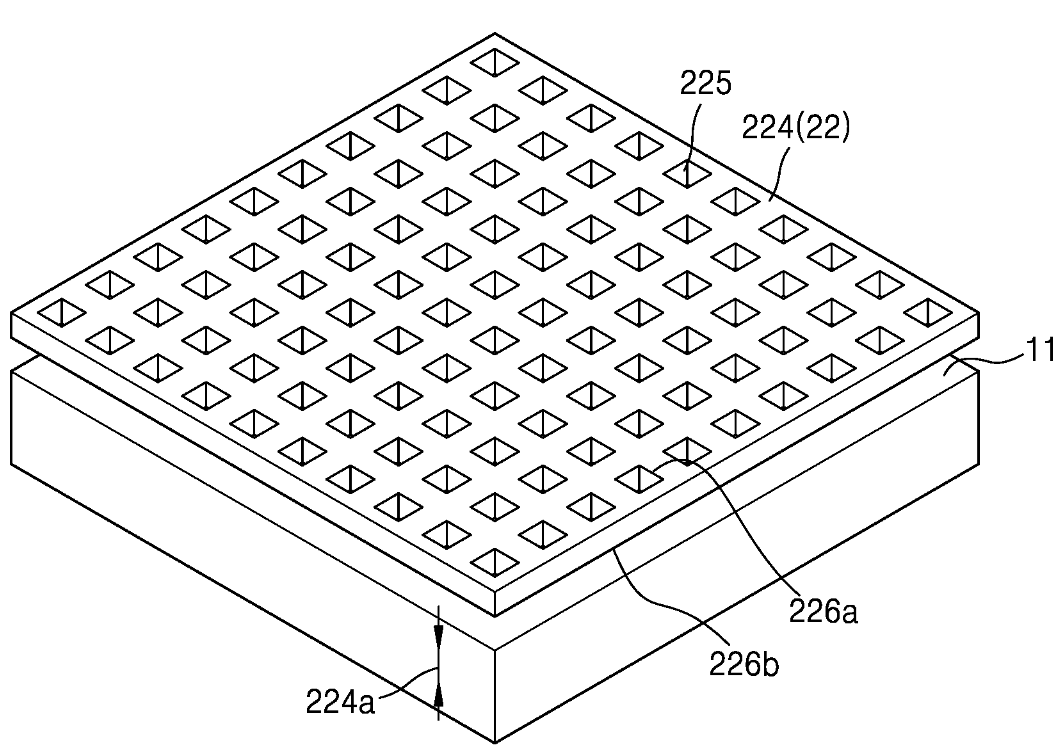
FIG. 10 is a perspective view schematically illustrating a second wick structure having a suspended wick structure according to an embodiment.

For example, the second wick structure 22 may be a suspended wick structure. FIG. 10 is a schematic perspective view illustrating a second wick structure 22 according to an embodiment. In FIG. 10, only a bottom 11 of a cooling channel 10 (refer to FIG. 1) and the second wick structure 22 are briefly shown. Referring to FIG. 10, the second wick structure 22 is apart from the bottom 11 of the cooling channel 10. For example, the second wick structure 22 may include a grid plate 224 in which a plurality of square holes 225 are two-dimensionally arranged. Form factors of the square holes 225 and a distance **224*a* between the second wick structure 22 and the bottom 11 of the cooling channel 10 are determined by a capillary radius $r_c$ calculated by Equations 1 to 4 described above. For example, the distance 224*a* between the second wick structure 22 and the bottom 11 of the cooling channel 10 may be the same as a capillary distance. In other words, the distance 224*a* may be twice the capillary radius rc. Therefore, the second wick structure 22 may form capillary channels (first horizontal capillary channels 226*a*) capable of horizontally moving coolant by capillary force. In addition, the second wick structure 22 may form another capillary channel (second horizontal capillary channel 226*b*) capable of horizontally moving coolant between the bottom 11 of the cooling channel 10 and the second wick structure 22** by capillary force.

Although not shown in FIG. 10, a plurality of support pillars may be provided to maintain the distance **224*a* between the second wick structure 22 having a grating plate shape and the bottom 11 of the cooling channel 10. Owing to this configuration, the capillary channels formed by the second wick structure 22 may have large cross-sectional areas, thereby increasing the amount of liquid coolant LC flowing along the bottom 11 of the cooling channel 10** and improving cooling efficiency.

When the semiconductor device 1 is a highly-integrated, high-performance semiconductor device, a plurality of semiconductor chips 100 may be stacked in the semiconductor device 1. When the semiconductor device 1 has a stacked structure, the semiconductor device 1 may be referred to as a three dimensional integrated circuit (3D IC) device. When the semiconductor device 1 has a stacked structure, a plurality of semiconductor chips 100 may be closely stacked in the semiconductor device 1, and thus, an effective 2-phase cooling structure may be required for the semiconductor device 1. In this case, the semiconductor device 1 may employ the 2-phase cooling structure described above.

Figure 11:
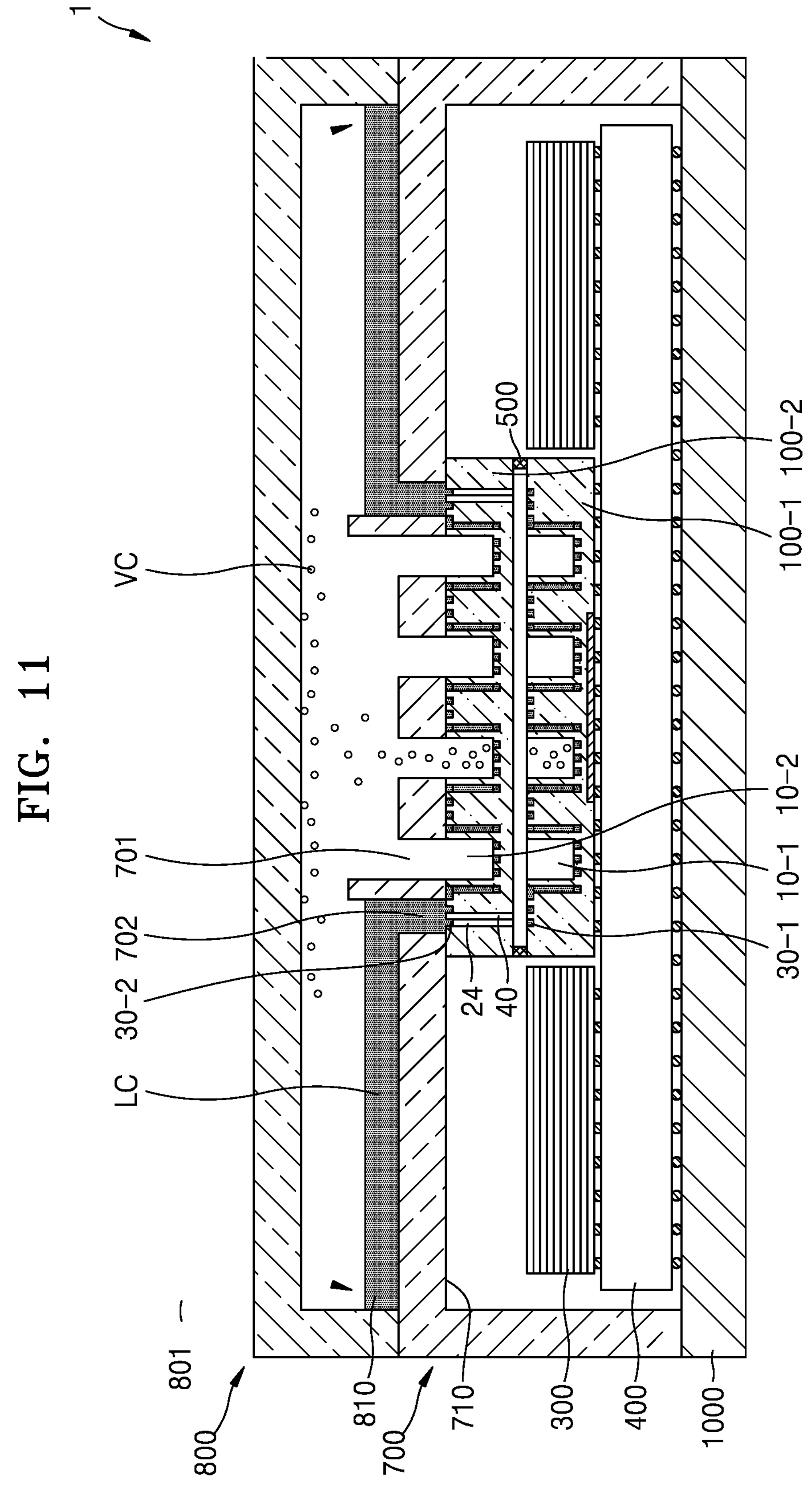
FIG. 11 is a view schematically illustrating a configuration of a semiconductor device according to an embodiment.
Figure 12:
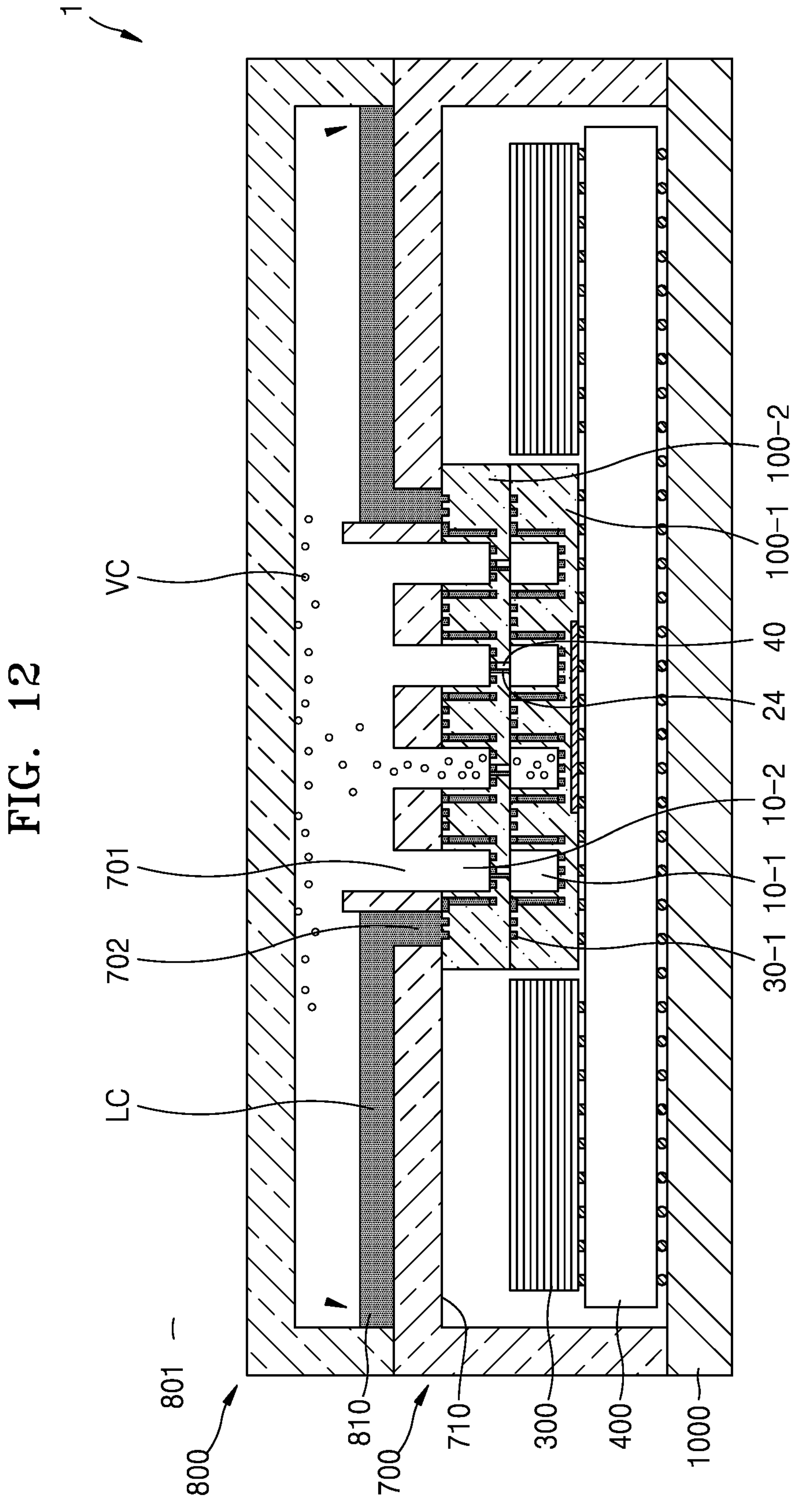
FIG. 12 is a view schematically illustrating a configuration of a semiconductor device according to an embodiment.

FIG. 11 is a view schematically illustrating a configuration of a semiconductor device 1 according to an embodiment. FIG. 12 is a view schematically illustrating another configuration of the semiconductor device 1 according to an embodiment. The semiconductor device 1 of the embodiments shown in FIGS. 11 and 12 includes a plurality of semiconductor chips and is thus different from the semiconductor device 1 of the embodiment shown in FIG. 1. In the following description, like reference numerals denote like elements, and repeated descriptions thereof are omitted.

Referring to FIGS. 11 and 12, the semiconductor device 1 may include a plurality of semiconductor chips, for example, a first semiconductor chip 100-1 and a second semiconductor chip 100-2. The second semiconductor chip 100-2 is disposed on the first semiconductor chip 100-1. Cooling channels 10-1 and 10-2 and supply channels 30-1 and 30-2 are formed respectively in the first and second semiconductor chips 100-1 and 100-2. The above descriptions of the cooling channel 10 and the supply channel 30 apply to the cooling channels 10-1 and 10-2 and the supply channels 30-1 and 30-2. The first semiconductor chip 100-1 may have the same structure as the semiconductor chip 100 of the embodiment shown in FIG. 1. The second semiconductor chip 100-2 further includes a connection channel 40 compared to the semiconductor chip 100 of the embodiment shown in FIG. 1. A connection wick structure 24 may be provided in the connection channel 40 to generate capillary force for moving liquid coolant LC in the vertical direction, that is, in the second direction Z. For example, the connection wick structure 24 may protrude from a side wall of the connection channel 40 and may extend in the second direction Z. In other words, the first wick structure 21 described above may be provided on the side wall of the connection channel 40 as the connection wick structure 24. A region of the connection channel 40 in which the connection wick structure 24 is formed is a liquid channel region 18 (refer to FIG. 2), and the other region of the connection channel 40 is a vapor channel region 19 (refer to FIG. 2).

Referring to the embodiment shown in FIG. 11, the connection channel 40 may connect the supply channel 30-2 of the second semiconductor chip 100-2 and the supply channel 30-1 of the first semiconductor chip 100-1 to each other. The connection channel 40 may penetrate the second semiconductor chip 100-2 to connect the supply channel 30-2 of the second semiconductor chip 100-2 and the supply channel 30-1 of the first semiconductor chip 100-1 to each other. In this case, as shown in FIG. 11, a lower surface of the second semiconductor chip 100-2 located on an upper side may be apart from an upper surface of the first semiconductor chip 100-1 located on a lower side. The supply channel 30-1 may be defined by the lower surface of the second semiconductor chip 100-2 and the upper surface of the first semiconductor chip 100-1. A sealing member 500 may be disposed between the lower surface of the second semiconductor chip 100-2 and the upper surface of the first semiconductor chip 100-1 to surround the outside of the supply channel 30-1. A region of the supply channel 30-1 in which a supply wick structure 23 (refer to FIG. 5) is formed may be a liquid channel region 18 (refer to FIG. 2), and a region of the supply channel 30-1 in which the supply wick structure 23 (refer to FIG. 5) is not formed may be a vapor channel region 19 (refer to FIG. 2).

Referring to the embodiment shown in FIG. 12, the connection channel 40 may connect the cooling channel 10-2 of the second semiconductor chip 100-2 and the cooling channel 10-1 of the first semiconductor chip 100-1 to each other. In this case, the connection channel 40 may be formed through a bottom 11 of the cooling channel 10-2 of the second semiconductor chip 100-2 and may be connected to the cooling channel 10-1 of the first semiconductor chip 100-1. When a plurality of cooling channels 10-2 are provided in the second semiconductor chip 100-2, connection channels 40 may be respectively provided in at least some of the cooling channels 10-2. The lower surface of the second semiconductor chip 100-2 and the upper surface of the first semiconductor chip 100-1 may be in contact with each other. Alternatively, as shown in FIG. 11, the lower surface of the second semiconductor chip 100-2 may be apart from the upper surface of the first semiconductor chip 100-1, and thus the supply channel 30-1 may be defined by the lower surface of the second semiconductor chip 100-2 and the upper surface of the first semiconductor chip 100-1. In this case, the supply channel 30-1 may be sealed by the sealing member 500.

The first semiconductor chip 100-1 may be mounted on a printed circuit board 1000 with an interposer 400 therebetween. The second semiconductor chip 100-2 may be directly electrically connected to the printed circuit board 1000 through an electrical connection structure (not shown). Alternatively, the second semiconductor chip 100-2 may be electrically connected to the printed circuit board 1000 via the first semiconductor chip 100-1 by a penetration connection structure such as a Through Silicon Via (TSV).

The first and second semiconductor chips 100-1 and 100-2 are packaged by a package housing 700. The package housing 700 surrounds the first and second semiconductor chips 100-1 and 100-2. A supply opening 702 provided in the package housing 700 is connected to a coolant storage portion 810. The supply opening 702 is connected to the cooling channel 10-2 through the supply channel 30-2 of the second semiconductor chip 100-2. The connection channel 40 of the second semiconductor chip 100-2 may connect the supply channel 30-2 and the supply channel 30-1 to each other or the cooling channel 10-2 and the cooling channel 10-1 to each other. Therefore, liquid coolant LC may be supplied to the cooling channels 10-1 and 10-2 of the first and second semiconductor chips 100-1 and 100-2 through the supply opening 702 of the package housing 700. The cooling channel 10-1 of the first semiconductor chip 100-1 is connected to a discharge opening 701 of the package housing 700 through the connection channel 40. The cooling channel 10-2 of the second semiconductor chip 100-2 is connected to a condenser 800 through the discharge opening 701. Therefore, vapor coolant VC generated in the cooling channels 10-1 and 10-2 may be discharged to the condenser 800 through the discharge opening 701.

Liquid coolant LC is supplied to the cooling channels 10-1 and 10-2 provided in the first and second semiconductor chips 100-1 and 100-2 that are stacked. The liquid coolant LC may absorb heat from heat sources of the first and second semiconductor chips 100-1 and 100-2, for example, semiconductor integrated circuits 120 (refer to FIG. 1) of the first and second semiconductor chips 100-1 and 100-2 while moving along the liquid channel region 18, and thus, the liquid coolant LC may vaporize into vapor coolant VC. The vapor coolant VC may move from the liquid channel region 18 to the vapor channel region 19. A space of the liquid channel region 18 from which the vapor coolant VC has escaped may be filled with liquid coolant LC by capillary force. The vapor coolant VC may move to the condenser 800 along the vapor channel region 19. After the vapor coolant VC may condense into liquid coolant LC in the condenser 800, the liquid coolant LC may move to the coolant storage portion 810 and then into the first and second semiconductor chips 100-1 and 100-2 along the liquid channel region 18 of the cooling channels 10-1 and 10-2 owing to capillary force. In this manner, the liquid coolant LC may be supplied to positions close to the heat sources inside the stack of the first and second semiconductor chips 100-1 and 100-2. In addition, vapor coolant VC may be effectively discharged to the outside of the first and second semiconductor chips 100-1 and 100-2 along the vapor channel region 19. Therefore, the first and second semiconductor chips 100-1 and 100-2 may be effectively cooled.

Although FIGS. 11 and 12 illustrate a structure in which two semiconductor chips are stacked in the second direction Z, three or more semiconductor chips may be stacked in the second direction Z. In this case, connection channels 40 may be provided in semiconductor chips other than the lowermost semiconductor chip.

Figure 13:
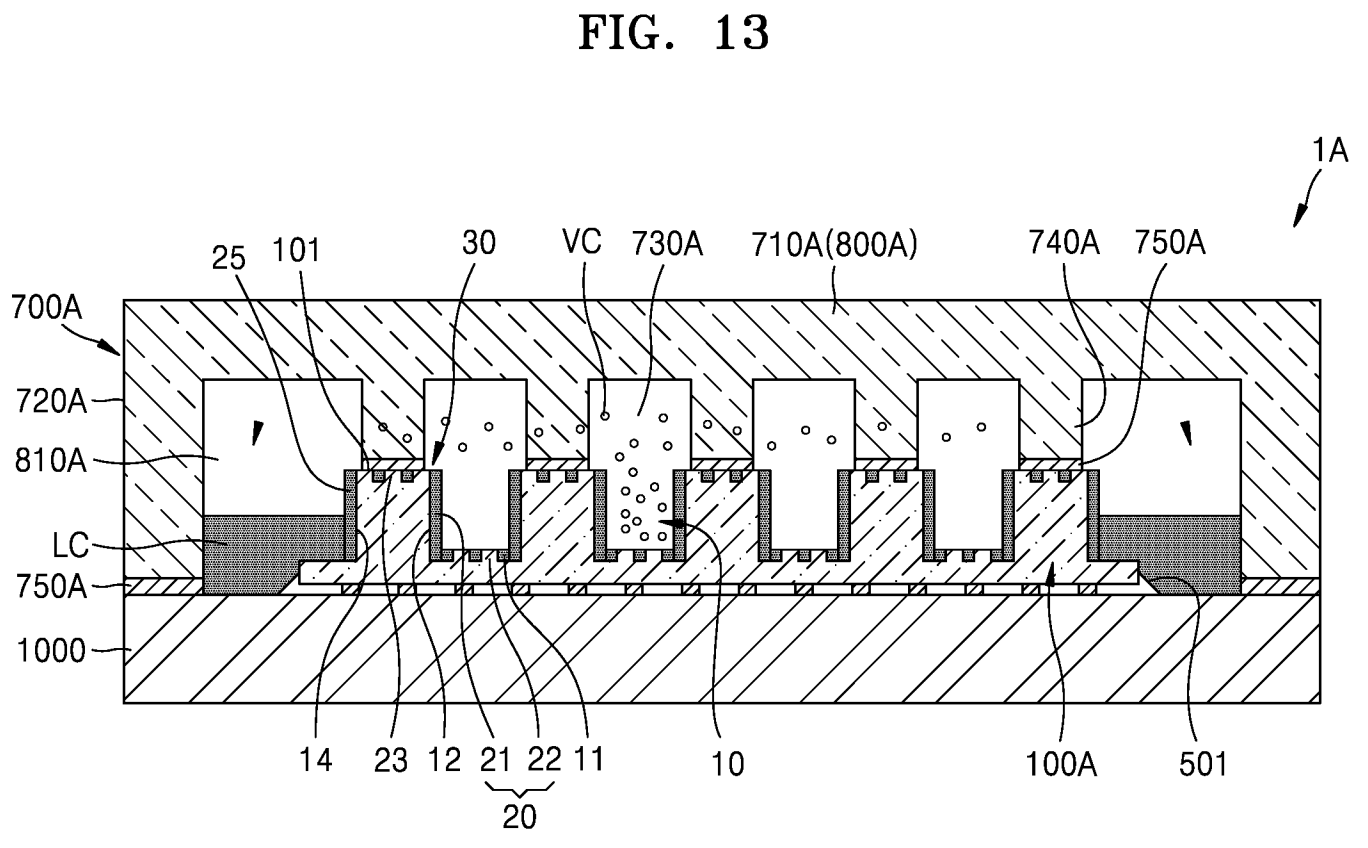

FIG. 13 is a view schematically illustrating a configuration of a semiconductor device 1A according to an embodiment. The current embodiment is different from the previous embodiments in that the semiconductor device 1A includes a coolant storage portion 810A provided in a package housing 700A. Hereinafter, the differences are mainly described. Elements having the same functions as those described above are denoted with the same reference numerals, and repeated descriptions thereof are omitted.

Referring to FIG. 13, a semiconductor chip 100A is mounted on a printed circuit board 1000. The semiconductor chip 100A is the same as the semiconductor chip 100 described above except for a structure for connection with the coolant storage portion 810A. A wiring layer (not shown) for electrical connection with the printed circuit board 1000 is provided on a lower surface of the semiconductor chip 100A, and the wiring layer is sealed by a sealing member 501 and is thus protected from coolant stored in the coolant storage portion 810A (described below). A plurality of cooling channels 10 are provided in the semiconductor chip 100A. A first wick structure 21 is provided on a side wall 12 of each of the cooling channels 10. The first wick structure 21 is a suspended wick structure which forms first vertical capillary channels 213 (refer to FIGS. 3A to 3C) and a second vertical capillary channel 212 (refer to FIGS. 3A to 3C) as described above. A second wick structure 22 is provided on a bottom 11 of each of the cooling channels 10. The second wick structure 22 may protrude from the bottom 11, and as shown in FIG. 10, the second wick structure 22 may be a suspended wick structure that forms first horizontal capillary channels 226*a* and a second horizontal capillary channel 226*b*. A supply channel 30 for guiding liquid coolant LC supplied from the coolant storage portion 810A to the cooling channels 10 is provided on an upper surface 101 of the semiconductor chip 100A. The supply channel 30 may include a supply wick structure 23 configured to generate capillary force for moving liquid coolant LC along the upper surface 101 of the semiconductor chip 100A.

The semiconductor chip 100A is packaged by a package housing 700A. The package housing 700A encloses the semiconductor chip 100 as a whole. The package housing 700A may include an upper wall 710A and a side wall 720A. The upper wall 710A is apart from the upper surface 101 of the semiconductor chip 100A, and a space 730A is formed between the upper surface 101 of the semiconductor chip 100A and the upper wall 710A. The cooling channels 10 communicate with the space 730A. Therefore, vapor coolant VC may move from the cooling channels 10 to the space 730A. The upper wall 710A may be in contact with ambient air. Although not shown in FIG. 13, cooling fins (refer to the cooling fins 801 shown in FIG. 1) may be arranged on an outer surface of the upper wall 710A. Therefore, the upper wall 710A of the package housing 700A may function like the condenser 800 described in the previous embodiments. Hereinafter, the upper wall 710A functioning a condenser may be referred to as a condenser 800A.

The side wall 720A is at least partially apart from an outer wall 14 of the semiconductor chip 100A, thereby forming the coolant storage portion 810A between the side wall 720A and the outer wall 14 of the semiconductor chip 100A. The side wall 720A extends from the upper wall 710A toward the printed circuit board 1000 and is supported on an upper surface of the printed circuit board 1000. Therefore, the coolant storage portion 810A is formed inside the package housing 700A by the outer wall 14 of the semiconductor chip 100A, the side wall 720A, and the upper surface of the printed circuit board 1000. For example, the coolant storage portion 810A may at least partially surround a side of the semiconductor chip 100A. The coolant storage portion 810A communicates with the space 730A formed between the upper wall 710A and the upper surface 101 of the semiconductor chip 100A. An outer supply wick structure 25 may be provided on the outer wall 14 of the semiconductor chip 100A. The outer supply wick structure 25 may generate capillary force for moving liquid coolant LC from the coolant storage portion 810A to the supply channel 30. The outer supply wick structure 25 may be a normal wick structure provided on the outer wall 14. Like the first wick structure 21, the outer supply wick structure 25 may be a suspended wick structure that is apart from the outer wall 14.

The semiconductor device 1A may further include a heat transfer member 740A. The heat transfer member 740A may transfer heat from the semiconductor chip 100A to the upper wall 710A. The heat transfer member 740A may extend from the upper wall 710A and may be in contact with the upper surface 101 of the semiconductor chip 100A. A plurality of heat transfer members 740A may extend from the upper wall 710A and may be in contact with the upper surface 101 of the semiconductor chip 100A. The heat transfer member 740A transfers heat from the semiconductor chip 100A to the upper wall 710A by conduction. Therefore, the semiconductor chip 100A may be more effectively cooled.

A thermal interface material (TIM) 750A may be disposed between the heat transfer member 740A and the upper surface 101 of the semiconductor chip 100A. The TIM 750A reduces thermal boundary resistance between the heat transfer member 740A and the upper surface 101 of the semiconductor chip 100A, and relieves thermal stress caused by a thermal expansion coefficient difference between the heat transfer member 740A and the semiconductor chip 100A. Therefore, thermal coupling between the semiconductor chip 100A and the heat transfer member 740A may be improved, and thus, heat may be effectively transferred from the semiconductor chip 100A to the upper wall 710A. The TIM 750A may be implemented in various forms such as paste, an adhesive, a pad, or a filler. The TIM 750A may also be disposed between the side wall 720A and the upper surface of the printed circuit board 1000. Therefore, heat may be transferred from the printed circuit board 1000 to the package housing 700A.

Owing to capillary force generated by the outer supply wick structure 25, liquid coolant LC accommodated in the coolant storage portion 810A may be supplied along the outer wall 14 of the semiconductor chip 100A to the supply channel 30 formed on the upper surface 101 of the semiconductor chip 100A. The liquid coolant LC may flow along the upper surface 101 of the semiconductor chip 100 to the side wall 12 of each of the cooling channels 10 owing to capillary force generated by the supply wick structure 23. The liquid coolant LC may be supplied to the bottom 11 of each of the cooling channels 10 along the side wall 12 of each of the cooling channels 10 owing to capillary force generated by the first wick structure 21. The second wick structure 22 generates capillary force such that the liquid coolant LC may move along the bottom 11 of each of the cooling channels 10 and entirely cover the bottom 11 of each of the cooling channels 10. The liquid coolant LC may absorb heat from a semiconductor integrated circuit 120 (refer to FIG. 1) and may thus vaporize into vapor coolant VC. The vapor coolant VC may move to the space 730A and condense into liquid coolant LC at the condenser 800A by exchanging heat with the outside of the condenser 800A. The liquid coolant LC may be accommodated in the coolant storage portion 810A.

Figure 14:
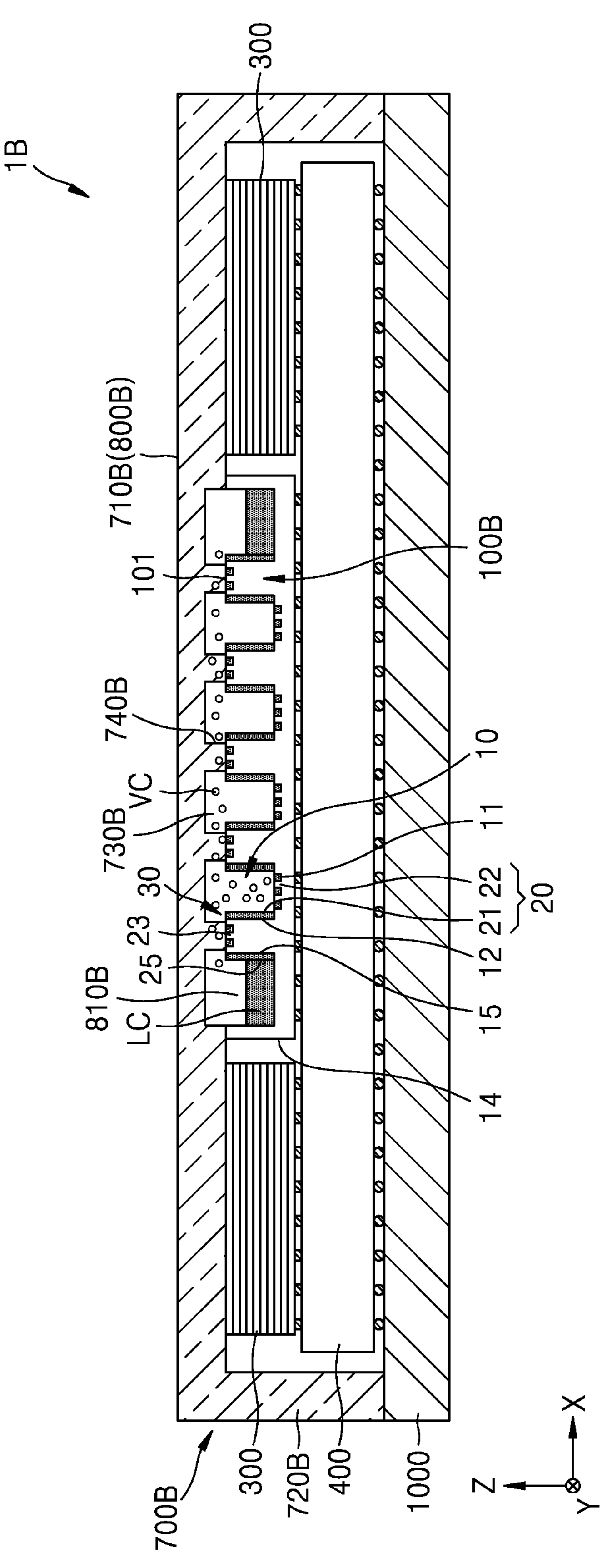
FIG. 14 is a view schematically illustrating a configuration of a semiconductor device according to an embodiment.

FIG. 14 is a view schematically illustrating a configuration of a semiconductor device 1B according to an embodiment. The semiconductor device 1B of the current embodiment is different from the semiconductor device 1A shown in FIG. 13 in that a coolant storage portion 810B is formed in a semiconductor chip 100B, and the semiconductor chip 100B is mounted on a printed circuit board 1000 with an interposer 400 therebetween. Hereinafter, the differences are mainly described. Elements having the same functions as those described above are denoted with the same reference numerals, and repeated descriptions thereof are omitted.

Referring to FIG. 14, the semiconductor chip 100B and HBMs 300 are mounted on the printed circuit board 1000 with the interposer 400 therebetween. The semiconductor chip 100B is the same as the semiconductor chip 100A shown in FIG. 13 except that the semiconductor chip 100B includes the coolant storage portion 810B. A plurality of cooling channels 10 are provided in the semiconductor chip 100B. A first wick structure 21 that is a suspended wick structure is provided on a side wall 12 of each of the cooling channels 10. A second wick structure 22 is provided on a bottom 11 of each of the cooling channels 10. The second wick structure 22 may be a wick structure protruding from the bottom 11 or a suspended wick structure as shown in FIG. 10. A supply channel 30 is provided on an upper surface 101 of the semiconductor chip 1001B. The supply channel 30 may have a supply wick structure 23 configured to generate capillary force for moving liquid coolant LC along the upper surface 101 of the semiconductor chip 100B. The coolant storage portion 810B is formed at a position adjacent to an outer wall 14 of the semiconductor chip 100B by recessing the upper surface 101 of the semiconductor chip 100B. One or more coolant storage portions 810B may be formed. An outer supply wick structure 25 may be provided on a side wall 15 of the coolant storage portion 810B. The outer supply wick structure 25 may generate capillary force for moving liquid coolant LC from the coolant storage portion 810B into the supply channel 30. The outer supply wick structure 25 may be a normal wick structure or may be a suspended wick structure spaced apart from the side wall 15 of the coolant storage portion 810B like the first wick structure 21.

The semiconductor chip 100B and the HBMs 300 are packaged by a package housing 700B. The package housing 700B encloses the semiconductor chip 100B and the HBMs 300 as a whole. The package housing 700B may include an upper wall 710B and a side wall 720B. The upper wall 710B is partially apart from the upper surface 101 of the semiconductor chip 100B, and thus a space 730B is formed between the upper surface 101 of the semiconductor chip 100B and the upper wall 710B. The cooling channels 10 communicate with the space 730B. Therefore, vapor coolant VC may flow from the cooling channels 10 to the space 730B. The upper wall 710B may be in contact with ambient air. Although not shown in FIG. 14, cooling fins (refer to the cooling fins 801 shown in FIG. 1) may be arranged on an outer surface of the upper wall 710B. Therefore, the upper wall 710B of the package housing 700B may function like the condenser 800 described in the previous embodiments. Hereinafter, the upper wall 710B functioning as a condenser is referred to as a condenser 800B. The coolant storage portion 810B concavely provided in the semiconductor chip 100B may communicate with the space 730B. Therefore, vapor coolant VC may be condensed into liquid coolant LC by the condenser 800B and stored in the coolant storage portion 810B. The side wall 720B extends from an outer edge of the upper wall 710B and is supported on an upper surface of the printed circuit board 1000.

The semiconductor device 1B may include one or more heat transfer members 740B extending from the upper wall 710B of the package housing 700B and making contact with the upper surface 101 of the semiconductor chip 100B to transfer heat from the semiconductor chip 100B to the upper wall 710A. The semiconductor chip 100B may include a plurality of more heat transfer members 740B. Although not shown in FIG. 14, a TIM may be disposed between the heat transfer members 740B and the upper surface 101 of the semiconductor chip 100B. A TIM may also be disposed between the side wall 720B of the package housing 700B and the upper surface of the printed circuit board 1000.

Liquid coolant LC accommodated in the coolant storage portion 810B may flow along the side wall 15 of the coolant storage portion 810B to the supply channel 30 formed on the upper surface 101 of the semiconductor chip 100B owing to capillary force generated by the outer supply wick structure 25. The liquid coolant LC may flow along the upper surface 101 of the semiconductor chip 100B toward the side wall 12 of each of the cooling channels 10 owing capillary force generated by the supply wick structure 23. The liquid coolant LC may be supplied to the bottom 11 of each of the cooling channels 10 through the side wall 12 of each of the cooling channels 10 owing to capillary force generated by the first wick structure 21. The liquid coolant LC may flow along the bottom 11 of each of the cooling channels 10 and entirely cover the bottom 11 of each of the cooling channels 10 owing to capillary force generated by the second wick structure 22. The liquid coolant LC may be heated by absorbing heat from a semiconductor integrated circuit 120 (refer to FIG. 1) and may thus vaporize into vapor coolant VC. The vapor coolant VC moves to the space 730B and condenses into liquid coolant LC at the concenter 800B by exchanging heat with the outside. The liquid coolant LC is then accommodated in the coolant storage portion 810B.

Figure 15:
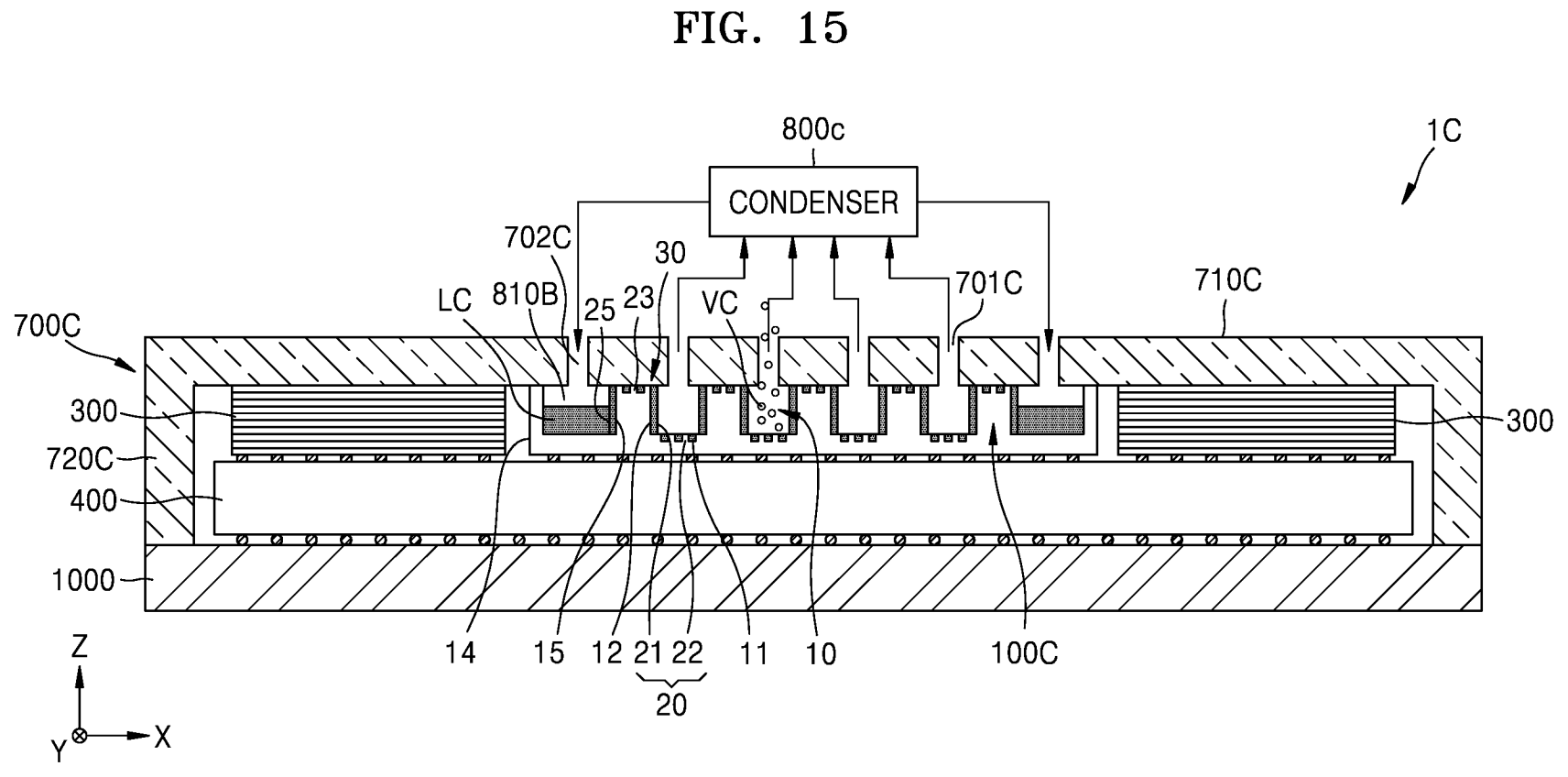

FIG. 15 is a view schematically illustrating a configuration of a semiconductor device 1C according to an embodiment. The semiconductor device 1C of the current embodiment is different from the semiconductor device 1B shown in FIG. 14 in that a condenser 800C is provided outside a package housing 700C. Hereinafter, the difference is mainly described. Elements having the same functions as those described above are denoted with the same reference numerals, and repeated descriptions thereof are omitted.

Referring to FIG. 15, a semiconductor chip 100C and the HBMs 300 are packaged by the package housing 700C. The package housing 700C encloses the semiconductor chip 100C and the HBMs 300 as a whole. The package housing 700C may include an upper wall 710C and a side wall 720C. A supply channel 30 is formed between the upper wall 710C and an upper surface 101 of the semiconductor chip 100C. The side wall 720C extends from an outer edge of the upper wall 710C and is supported on a printed circuit board 1000. A discharge opening 701C and a supply opening 702C are provided in the upper wall 710C. The discharge opening 701C communicates with a cooling channel 10. When a plurality of cooling channels 10 are provided, a plurality of discharge openings 701C respectively corresponding to the cooling channels 10 may be provided in the upper wall 710C. The discharge openings 701C are connected to the condenser 800C. The supply opening 702C connects the condenser 800C to a coolant storage portion 810B provided in the semiconductor chip 100C.

Liquid coolant LC accommodated in the coolant storage portion 810B may flow along a side wall 15 of the coolant storage portion 810B to the supply channel 30 formed on the upper surface 101 of the semiconductor chip 100C owing to capillary force generated by an outer supply wick structure 25. The liquid coolant LC may flow along the upper surface 101 of the semiconductor chip 100C toward a side wall 12 of each of the cooling channels 10 owing to capillary force generated by a supply wick structure 23. The liquid coolant LC may be supplied to a bottom 11 of each of the cooling channels 10 through the side wall 12 of each of the cooling channels 10 owing to capillary force generated by a first wick structure 21. The liquid coolant LC may flow along the bottom 11 of each of the cooling channels 10 and cover the bottom 11 of each of the cooling channels 10 owing to capillary force generated by the second wick structure 22. The liquid coolant LC may be heated by absorbing heat from a semiconductor integrated circuit 120 (refer to FIG. 1) and may thus vaporize into vapor coolant VC. The vapor coolant VC may flow to the condenser 800C through the discharge openings 701C and condense into the liquid coolant LC by exchanging heat with the outside at the condenser 800B. The liquid coolant LC may move into the coolant storage portion 810B through the supply opening 702C.

As described above, the semiconductor device includes a suspended wick structure, thereby increasing the flow rate of coolant and improving cooling performance.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A semiconductor device comprising:
- a semiconductor chip;
- a cooling channel configured to allow a coolant to (i) flow in liquid phase and (ii) absorb heat generated by the semiconductor chip during operation; and
- a wick structure configured to generate a capillary force for moving the coolant in the liquid phase along a wall surface of the cooling channel,
- wherein the wick structure comprises a suspended wick structure that is disposed apart from the wall surface by a capillary distance,
- wherein the cooling channel is formed by recessing an upper surface of the semiconductor chip and comprises:
  - a bottom disposed in a horizontal direction parallel to an upper surface of the semiconductor chip; and
  - a side wall disposed in a vertical direction, the side wall connecting the upper surface of the semiconductor chip and the bottom of the cooling channel to each other,
- wherein the suspended wick structure comprises a first wick structure that is disposed apart from the side wall of the cooling channel.

2. The semiconductor device of claim 1, wherein the first wick structure is configured to form:
- a first vertical capillary channel that is configured to move the coolant in the vertical direction inside the cooling channel; and
- a second vertical capillary channel that is disposed between the first wick structure and the side wall of the cooling channel and is configured to move the coolant in the vertical direction.

3. The semiconductor device of claim 2, wherein the first wick structure comprises a plurality of ridges extending from the bottom of the cooling channel to positions adjacent to the upper surface of the semiconductor chip.

4. The semiconductor device of claim 1, wherein the wick structure further comprises a second wick structure that is disposed on the bottom of the cooling channel and is configured to move the coolant along the bottom of the cooling channel in the horizontal direction by generating a second capillary force.

5. The semiconductor device of claim 1, wherein the suspended wick structure further comprises a second wick structure that is disposed apart from the bottom of the cooling channel.

6. The semiconductor device of claim 1, further comprising a package housing enclosing the semiconductor chip,
- wherein the package housing comprises:
  - a discharge opening through which the coolant is configured to be discharged in vapor phase from the cooling channel; and
  - a supply opening through which the coolant is configured to be supplied in the liquid phase to the cooling channel.

7. The semiconductor device of claim 6,
- wherein the cooling channel comprises a plurality of cooling channels disposed in the semiconductor chip, and
- wherein the discharge opening comprises a plurality of discharge openings disposed in the package housing and respectively corresponding to the plurality of cooling channels.

8. The semiconductor device of claim 6, further comprising a supply channel configured to guide the coolant supplied in the liquid phase through the supply opening to the cooling channel,
- wherein the supply channel comprises a supply wick structure that is disposed on an upper surface of the semiconductor chip and is configured to generate a second capillary force for moving the coolant in the liquid phase along the upper surface of the semiconductor chip.

9. The semiconductor device of claim 1, further comprising:
- a coolant storage portion configured to accommodate the coolant in the liquid phase and supply the coolant in the liquid phase to the cooling channel;
- a supply channel comprising a supply wick structure that is disposed on an upper surface of the semiconductor chip and is configured to generate a second capillary force for moving the coolant in the liquid phase along the upper surface of the semiconductor chip, the supply channel being configured to guide the coolant supplied in the liquid phase from the coolant storage portion to the cooling channel; and
- a package housing enclosing the semiconductor chip,
- wherein the coolant storage portion is disposed in the package housing.

10. The semiconductor device of claim 9, wherein the package housing comprises:

an upper wall disposed apart from the upper surface of the semiconductor chip to form a space between the upper wall and the upper surface of the semiconductor chip, the space being disposed in communication with the cooling channel; and a side wall disposed apart from an outer wall of the semiconductor chip, the side wall forming the coolant storage portion between the side wall and the outer wall of the semiconductor chip, wherein an outer supply wick structure is disposed on the outer wall of the semiconductor chip to generate a third capillary force for supplying the coolant accommodated in the liquid phase inside the coolant storage portion to the supply channel.

11. The semiconductor device of claim 9, wherein the coolant storage portion is formed by recessing the upper surface of the semiconductor chip, and wherein an outer supply wick structure is disposed on a side wall of the coolant storage portion is configured to generate a third capillary force for supplying the coolant accommodated in the liquid phase inside the coolant storage portion to the supply channel.

12. The semiconductor device of claim 1, wherein the semiconductor chip comprises a plurality of semiconductor chips, wherein the cooling channel comprises a plurality of cooling channels, wherein each of the plurality of semiconductor chips respectively comprises a corresponding cooling channel of the plurality of cooling channels, wherein the plurality of semiconductor chips are stacked in the vertical direction, wherein each of the plurality of semiconductor chips except for a lowermost semiconductor chip comprises a connection channel penetrating therethrough in the vertical direction, and wherein a connection wick structure is disposed on at least a portion of a wall surface of the connection channel that is configured to move the coolant in the liquid phase by generating a second capillary force.

13. A semiconductor device comprising:

a semiconductor chip;

a supply channel disposed on an upper surface of the semiconductor chip that is configured to move a coolant in liquid phase along the upper surface of the semiconductor chip by capillary action;

a cooling channel formed by recessing the upper surface of the semiconductor chip, the cooling channel comprising:

a bottom that is parallel to the upper surface and a side wall that connects the upper surface of the semiconductor chip and the bottom to each other; and a first wick structure disposed apart from the side wall of the cooling channel that is configured to supply the coolant in the liquid phase to the bottom of the cooling channel along the side wall of the cooling channel by capillary action.

14. The semiconductor device of claim 13, further comprising a second wick structure configured to move the coolant along the bottom of the cooling channel by capillary action.

15. The semiconductor device of claim 14, wherein the second wick structure is disposed apart from the bottom of the cooling channel.

16. The semiconductor device of claim 13, further comprising a package housing enclosing the semiconductor chip, wherein a supply opening is disposed in the package housing to form a path for supplying the coolant in the liquid phase to the supply channel.

17. The semiconductor device of claim 16, wherein a discharge opening communicating with the cooling channel is disposed in the package housing to discharge the coolant in vapor phase from the cooling channel when the coolant transitions from the liquid phase to the vapor phase in the cooling channel by absorbing heat from the semiconductor chip.

18. The semiconductor device of claim 17, wherein the supply opening and the discharge opening are disposed apart from each other.

19. The semiconductor device of claim 13, further comprising:

a coolant storage portion configured to accommodate the coolant in the liquid phase and supply the coolant in the liquid phase to the cooling channel; and a package housing enclosing the semiconductor chip, wherein the supply channel comprises a supply wick structure that is disposed on the upper surface of the semiconductor chip and is configured to move the coolant in liquid phase along the upper surface of the semiconductor chip by capillary action, wherein the supply channel guides the coolant supplied in the liquid phase from the coolant storage portion to the cooling channel, and wherein the coolant storage portion is disposed in the package housing.

* * * * *